(12) United States Patent
Byun et al.

(10) Patent No.: US 11,747,949 B2
(45) Date of Patent: Sep. 5, 2023

(54) INPUT SENSING PANEL, DISPLAY DEVICE HAVING THE SAME, AND METHOD OF MANUFACTURING THE DISPLAY DEVICE

(71) Applicant: Samsung Display Co., Ltd., Yongin-si (KR)

(72) Inventors: Jin-Su Byun, Seoul (KR); Woongsik Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/836,929

(22) Filed: Jun. 9, 2022

(65) Prior Publication Data

US 2022/0413657 A1 Dec. 29, 2022

(30) Foreign Application Priority Data

Jun. 23, 2021 (KR) .......................... 10-2021-0081820

(51) Int. Cl.
| | |
|---|---|
| *G06F 3/044* | (2006.01) |
| *G06F 3/041* | (2006.01) |
| *H10K 59/40* | (2023.01) |
| *G09G 3/3233* | (2016.01) |
| *H10K 59/122* | (2023.01) |

(52) U.S. Cl.
CPC .......... *G06F 3/0446* (2019.05); *G06F 3/0412* (2013.01); *G06F 3/0443* (2019.05); *H10K 59/40* (2023.02); *G06F 2203/04103* (2013.01); *G06F 2203/04111* (2013.01); *G09G 3/3233* (2013.01); *G09G 2300/0426* (2013.01); *G09G 2300/0809* (2013.01); *G09G 2320/0238* (2013.01); *H10K 59/122* (2023.02)

(58) Field of Classification Search
None
See application file for complete search history.

(56) References Cited

U.S. PATENT DOCUMENTS

| | | |
|---|---|---|
| 10,025,432 B2 | 7/2018 | Kishioka et al. |
| 10,311,283 B2 | 6/2019 | Lee et al. |
| 10,572,080 B2 | 2/2020 | Lee et al. |
| 11,042,237 B2 | 6/2021 | Lee et al. |
| 2012/0249441 A1 | 10/2012 | Lee et al. |
| 2014/0203893 A1 | 7/2014 | Kando et al. |

(Continued)

FOREIGN PATENT DOCUMENTS

| | | | | |
|---|---|---|---|---|
| CN | 210429887 U | * | 4/2020 | |
| CN | 113056827 A | * | 6/2021 | ......... H01L 27/3262 |

(Continued)

*Primary Examiner* — Duane N Taylor, Jr.
(74) *Attorney, Agent, or Firm* — H.C. Park & Associates, PLC

(57) ABSTRACT

A display device including a display panel including a pixel and an input sensing panel including a first sensing insulating layer disposed on the display panel, a first conductive layer disposed on the first sensing insulating layer, a second sensing insulating layer covering the first conductive layer, a second conductive layer disposed on the second sensing insulating layer and including a plurality of mesh lines, a passivation layer disposed on the second conductive layer, and a third sensing insulating layer covering the passivation layer. The passivation layer has the same shape as that of the second conductive layer when viewed in a plan view.

17 Claims, 21 Drawing Sheets

(56) References Cited

U.S. PATENT DOCUMENTS

| | | |
|---|---|---|
| 2015/0169104 A1 | 6/2015 | Park et al. |
| 2017/0060325 A1 | 3/2017 | Chen |
| 2020/0174602 A1 | 6/2020 | Feng |
| 2022/0291798 A1* | 9/2022 | Wang .................. G09G 3/3275 |
| 2022/0326774 A1 | 10/2022 | Ono et al. |

FOREIGN PATENT DOCUMENTS

| | | | |
|---|---|---|---|
| CN | 113097285 A | * | 7/2021 |
| EP | 2386937 | | 11/2011 |
| KR | 10-1588429 | | 1/2016 |
| KR | 10-1636901 | | 7/2016 |
| KR | 10-2017-0141115 | | 12/2017 |
| KR | 10-2020-0071190 | | 6/2020 |
| KR | 10-2020-0108148 | | 9/2020 |
| WO | 2021053785 | | 3/2021 |

* cited by examiner

INPUT SENSING PANEL, DISPLAY DEVICE HAVING THE SAME, AND METHOD OF MANUFACTURING THE DISPLAY DEVICE

CROSS-REFERENCE TO RELATED APPLICATION

This application claims priority from and the benefit of Korean Patent Application No. 10-2021-0081820, filed on Jun. 23, 2021, which is hereby incorporated by reference for all purposes as if fully set forth herein.

BACKGROUND

Field

Embodiments of the invention relate generally to a display device including an input sensing panel with improved sensing sensitivity and a method of manufacturing the display device.

Discussion of the Background

A display device includes a display panel that displays an image and an input sensing panel that senses an external input. The input sensing panel is integrally formed with the display panel through successive processes. In other words, the input sensing panel is coupled to the display panel after being manufactured through a separate process from that of the display panel.

The above information disclosed in this Background section is only for understanding of the background of the inventive concept, and, therefore, it may contain information that does not constitute prior art.

SUMMARY

Embodiments of the invention provide an input sensing panel with improved strength and sensing sensitivity.

Embodiments of the invention also provide a display device including the input sensing panel.

Embodiments of the invention also provide a method of manufacturing the display device.

Additional features of the inventive concept will be set forth in the description which follows, and in part will be apparent from the description, or may be learned by practice of the inventive concept.

Embodiments of the inventive concept provide a display device including a display panel including a base layer, a circuit element layer including a transistor disposed on the base layer, a display element layer including a light emitting element connected to the transistor, and a thin film encapsulation layer covering the display element layer and an input sensing panel including a first sensing insulating layer disposed directly on the thin film encapsulation layer, a first conductive layer disposed on the first sensing insulating layer, a second sensing insulating layer covering the first conductive layer, a second conductive layer disposed on the second sensing insulating layer, a passivation layer disposed on the second conductive layer, and a third sensing insulating layer covering the passivation layer. The passivation layer has a permittivity higher than a permittivity of the third sensing insulating layer.

The passivation layer includes one of silicon nitride, silicon oxide, and silicon oxynitride, and the third sensing insulating layer includes an organic material.

The passivation layer makes contact with the second conductive layer and has a shape corresponding to the second conductive layer when viewed in a plan view.

A thickness of the passivation layer is less than a thickness of the third sensing insulating layer.

A side surface of the passivation layer and a side surface of the second conductive layer are aligned with each other and are inclined at a predetermined angle with respect to the second sensing insulating layer.

A portion of the second sensing insulating layer, which overlaps the passivation layer, has a thickness greater than a thickness of the other portion of the second sensing insulating layer.

A portion of an upper surface of the second conductive layer that makes contact with the passivation layer is in contact with the third sensing insulating layer without being covered by the passivation layer.

An upper surface of the second conductive layer and a side surface connected to the upper surface of the second conductive layer are covered by the passivation layer.

The display device further includes a high refractive index layer covering the third sensing insulating layer and having a refractive index greater than a refractive index of the third sensing insulating layer. A side surface of the passivation layer is exposed without being covered by the third sensing insulating layer.

The input sensing panel includes a first sensing electrode including first sensing patterns arranged in a first direction and a conductive pattern disposed between the first sensing patterns, a second sensing electrode insulated from the first sensing electrode and extending in a second direction crossing the first direction, and sensing lines connected to the first sensing electrode and the second sensing electrode. The first conductive layer includes the conductive pattern and a portion of the sensing lines, and the second conductive layer includes the first sensing patterns, the second sensing electrode, and the other portion of the sensing lines.

The second conductive layer includes a plurality of mesh lines extending in directions crossing each other, and the passivation layer has a shape corresponding to the mesh lines when viewed in a plan view.

The passivation layer does not overlap the sensing lines.

The first sensing patterns are connected to the conductive pattern via a sensing contact hole defined through the second sensing insulating layer.

The input sensing panel senses an external input by a capacitance method.

Embodiments of the inventive concept provide an input sensing panel including a first sensing insulating layer, a first conductive layer disposed on the first sensing insulating layer, a second sensing insulating layer covering the first conductive layer, a second conductive layer disposed on the second sensing insulating layer, a passivation layer disposed on the second conductive layer, and a third sensing insulating layer covering the passivation layer. A side surface of the passivation layer and a side surface of the second conductive layer are aligned with each other and are inclined at a predetermined angle with respect to the second sensing insulating layer.

The passivation layer includes one of silicon nitride, silicon oxide, and silicon oxynitride, and the third sensing insulating layer includes an organic material.

The passivation layer has a permittivity higher than a permittivity of the third sensing insulating layer.

Embodiments of the inventive concept provide a method of manufacturing a display device. The method includes forming a first sensing insulating layer on a display panel including an active area and a peripheral area, forming a first conductive layer on the first sensing insulating layer, forming a second sensing insulating layer to cover the first conductive layer, forming a second conductive layer including a conductive material on the second sensing insulating layer, forming a passivation layer on the second conductive layer, substantially simultaneously etching the second conductive layer and the passivation layer through a photoresist process, and forming a third sensing insulating layer to cover the passivation layer. The passivation layer includes an inorganic material.

When the second conductive layer and the passivation layer are substantially simultaneously etched, at least a portion of the second sensing insulating layer is removed to form a side surface of the second sensing insulating layer, which is aligned with a side surface of the second conductive layer.

The method further includes forming a contact hole through the first sensing insulating layer and the second sensing insulating layer in the peripheral area after the forming of the second sensing insulating layer and prior to the forming of the second conductive layer.

The method further includes removing the passivation layer in an area overlapping the contact hole to expose the second conductive layer after the second conductive layer and the passivation layer are substantially simultaneously etched.

According to the above, the passivation layer having a permittivity higher than that of the sensing insulating layer is disposed between the conductive layer and the sensing insulating layer. Thus, a variation in capacitance between the sensing electrodes and the external input increases. Accordingly, the display device having improved sensing sensitivity is provided.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concept.

DETAILED DESCRIPTION

Figure 1:
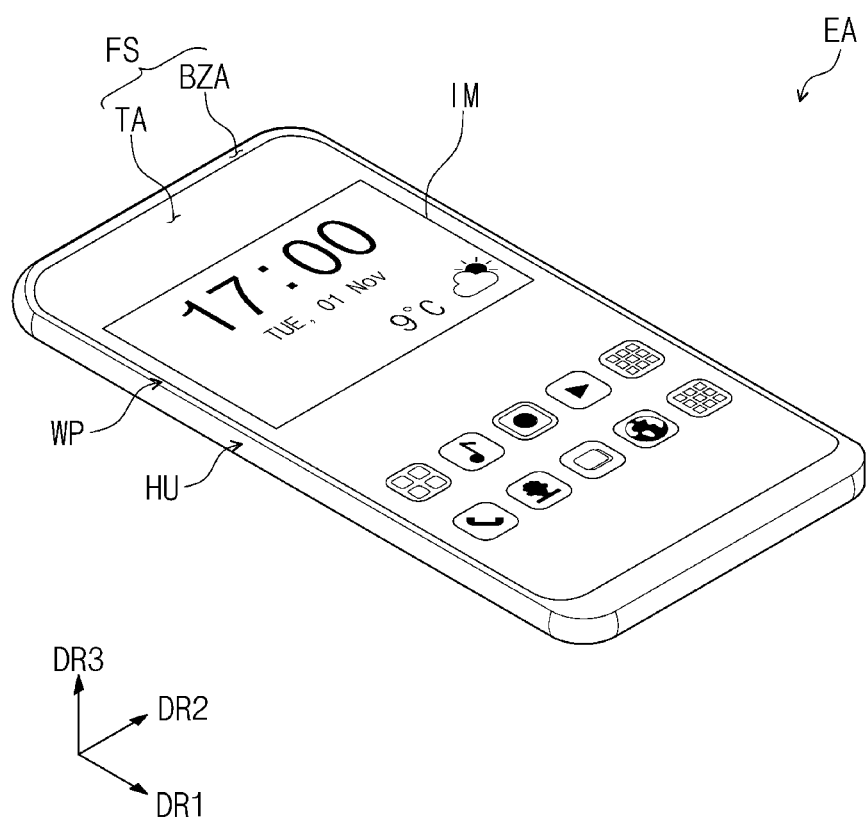
FIG. 1 is a perspective view showing a display device according to an embodiment of the present invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing the inventive concept disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concept.

Unless otherwise specified, the illustrated exemplary embodiments are to be understood as providing exemplary features of varying detail of some ways in which the inventive concept may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concept.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, the inventive concept will be explained in detail with reference to the accompanying drawings.

Figure 2:
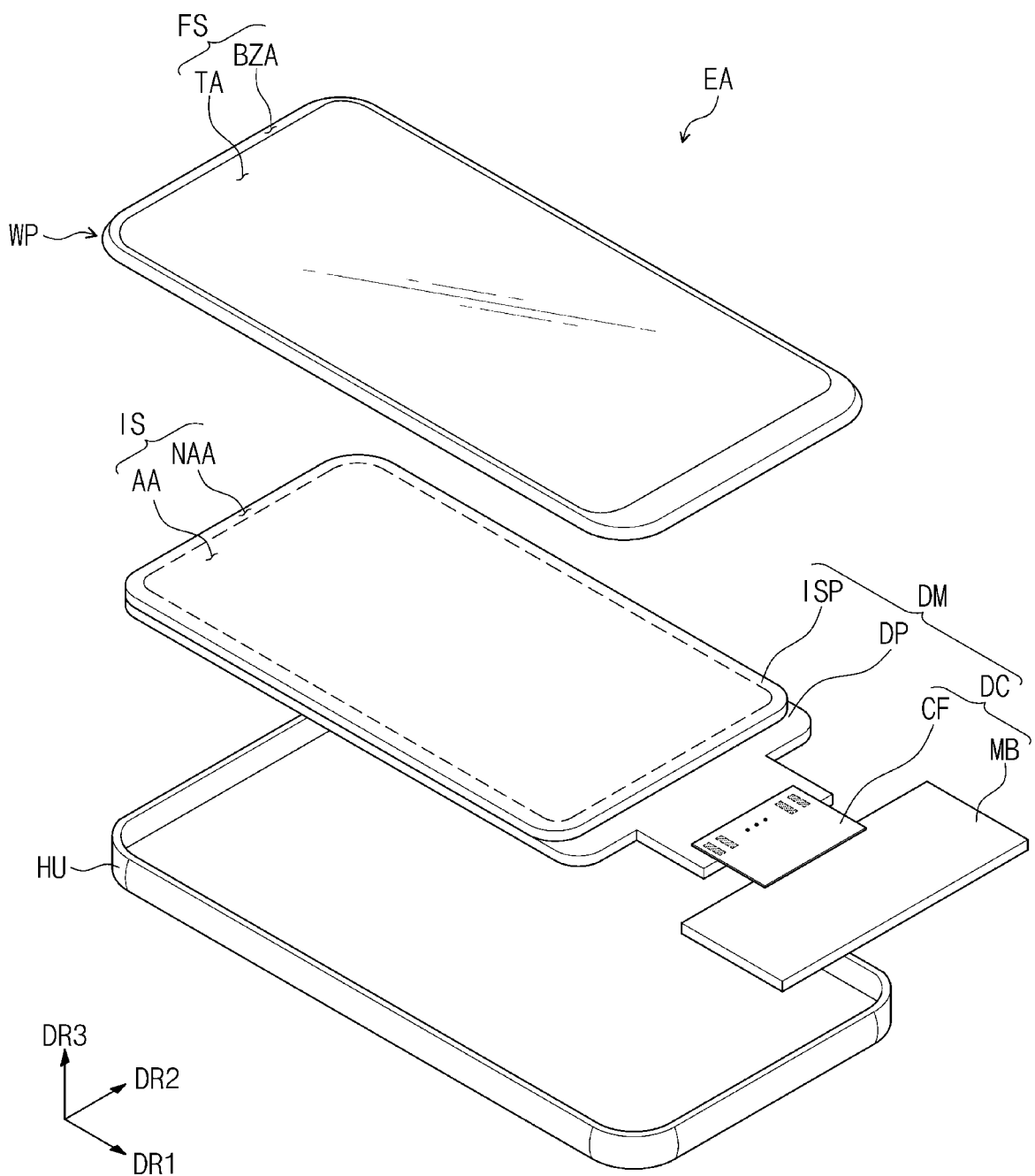
FIG. 2 is an exploded perspective view showing a display device according to an embodiment of the present invention.
Figure 3A:
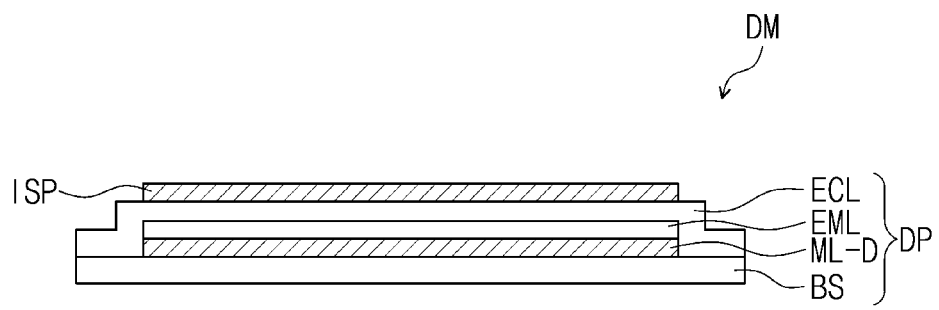
FIG. 3A is a cross-sectional view showing a display module according to an embodiment of the present invention.
Figure 3A:
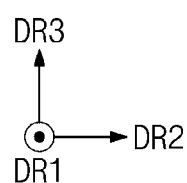
Figure 3B:
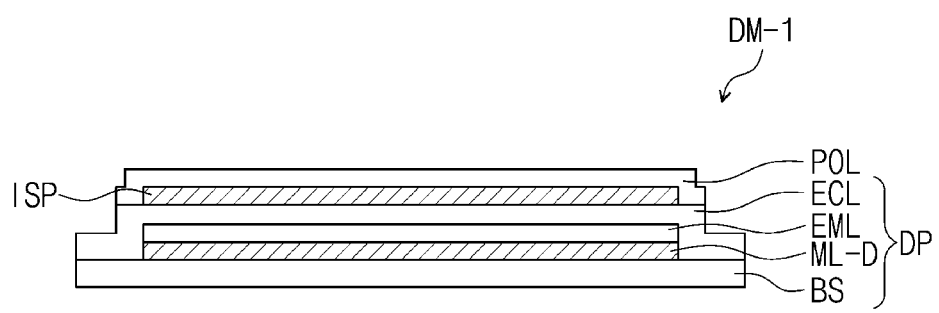
FIG. 3B is a cross-sectional view showing a display module according to an embodiment of the present invention.
Figure 3B:
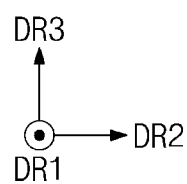
Figure 3C:
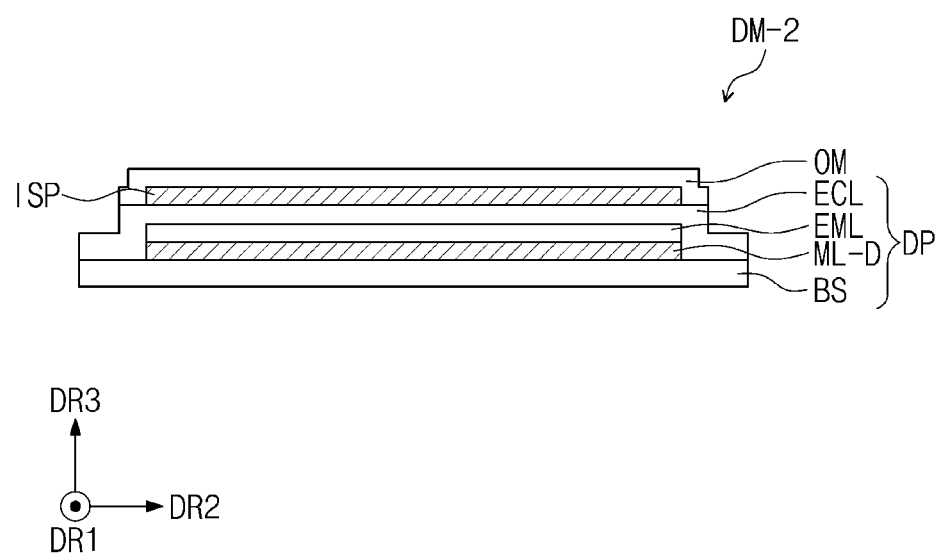
FIG. 3C is a cross-sectional view showing a display module according to an embodiment of the present invention.

FIG. 1 is a perspective view showing a display device EA according to an embodiment of the present invention. FIG. 2 is an exploded perspective view showing the display device EA according to an embodiment of the present invention. FIG. 3A is a cross-sectional view showing a display module DM according to an embodiment of the present invention. FIG. 3B is a cross-sectional view showing a display module DM-1 according to an embodiment of the present invention. FIG. 3C is a cross-sectional view showing a display module DM-2 according to an embodiment of the present invention.

Referring to FIGS. 1 and 2, the display device EA may be a device activated in response to an electrical signal. The display device EA may include various embodiments. For example, the display device EA may be applied to a large-sized electronic item, such as a television set, a monitor, or an outdoor billboard, and a small and medium-sized electronic item, such as a personal computer, a notebook computer, a personal digital assistant, a car navigation unit, a game unit, a mobile electronic device, and a camera.

These are merely examples, and thus, the display device EA may be applied to other electronic items as long as they do not depart from the inventive concept. In the present embodiment, a smartphone will be described as a representative example of the display device EA.

The display device EA may display an image IM through a display surface FS, which is substantially parallel to each of a first direction DR1 and a second direction DR2, toward a third direction DR3. The image IM may include a video and a still image. FIG. 1 shows a clock widget and application icons as a representative example of the image IM. The display surface FS through which the image IM is displayed may correspond to a front surface of the display device EA and a front surface of a window panel WP.

In the present embodiment, front (or upper) and rear (or lower) surfaces of each member of the display device EA are defined with respect to a direction in which the image IM is displayed. The front and rear surfaces are opposite to each other in the third direction DR3, and a normal line direction of each of the front and rear surfaces is substantially parallel to the third direction DR3. Directions indicated by the first, second, and third directions DR1, DR2, and DR3 are relative to each other, and thus, the directions indicated by the first, second, and third directions DR1, DR2, and DR3 may be changed to other directions. In the following descriptions, the expression "when viewed in a plan view" means a state of being viewed in the third direction DR3.

The display device EA may include the window panel WP, a display module DM, and a housing HU. In the present embodiment, the window panel WP and the housing HU are coupled to each other to provide an exterior of the display device EA.

The window panel WP may include an optically transparent insulating material. For example, the window panel WP may include a glass or plastic material. The window panel WP may have a single-layer or multi-layer structure. As an example, the window panel WP may include a plurality of plastic films attached to each other by an adhesive or a glass substrate and a plastic film attached to the glass substrate by an adhesive.

The front surface of the window panel WP may define the display surface FS of the display device EA as described above. A transmissive area TA may be an optically transparent area. For example, the transmissive area TA may be an area having a visible light transmittance of about 90% or more.

A bezel area BZA may be an area having a relatively lower transmittance than that of the transmissive area TA. The bezel area BZA may define a shape of the transmissive area TA. The bezel area BZA may be disposed adjacent to the transmissive area TA and surrounds the transmissive area TA.

The bezel area BZA may have a predetermined color. The bezel area BZA may cover a peripheral area NAA of the display module DM to prevent the peripheral area NAA from being viewed from the outside. However, this is merely one example, and the bezel area BZA may be omitted from the window panel WP according to an embodiment of the inventive concept.

The display module DM may display the image IM and sense an external input. The display module DM may include a front surface IS in which an active area AA and the peripheral area NAA are defined. The active area AA may be an area activated in response to an electrical signal.

In the present embodiment, the active area AA is an area through which the image IM is displayed and the external input is sensed. The transmissive area TA may overlap at least a portion of the active area AA. For example, the transmissive area TA may overlap an entire surface or at least a portion of the active area AA.

Accordingly, a user may perceive the image IM or provide the external input through the transmissive area TA, however, this is merely one example. That is, an area through which the image IM is displayed and an area through which the external input is sensed may be separated from each other in the active area AA of the display module DM, and they should not be limited to a particular embodiment.

The peripheral area NAA may be covered by the bezel area BZA. The peripheral area NAA may be disposed adjacent to the active area AA. The peripheral area NAA may surround the active area AA. A driving circuit or a driving line to drive the active area AA may be disposed in the peripheral area NAA.

The display module DM may include a display panel DP, an input sensing panel ISP, and a driving circuit DC.

The display panel DP may include configurations to generate the image IM. The image IM generated by the display panel DP may be viewed outside by the user through the transmissive area TA.

The input sensing panel ISP may sense the external input applied thereto from the outside. As described above, the input sensing panel ISP may sense the external input applied to the window panel WP.

The external input may include a variety of inputs provided from the outside of the display device EA. The external inputs may be provided in a variety of ways. For example, the external inputs may include a proximity input (e.g., hovering) applied when approaching close to or adjacent to the display device EA at a predetermined distance as well as a touch input by a part of the user's body (e.g., the user's hand). In addition, the external inputs may be provided in the form of pressure, light, etc., however, the inventive concept should not be limited thereto or thereby.

The driving circuit DC may be electrically connected to the display panel DP and the input sensing panel ISP. The driving circuit DC may include a main circuit board MB and a flexible circuit board CF.

The flexible circuit board CF may be electrically connected to the display panel DP. The flexible circuit board CF may connect the display panel DP and the main circuit board MB, however, this is merely one example. According to an embodiment, the flexible circuit board CF may not be connected to the main circuit board, and the flexible circuit board CF may be a rigid substrate.

The flexible circuit board CF may be connected to pads (display pads) of the display panel DP, which are disposed in the peripheral area NAA. The flexible circuit board CF may provide electrical signals to the display panel DP to drive the display panel DP. The electrical signals may be generated by the flexible circuit board CF or the main circuit board MB.

The main circuit board MB may include various driving circuits to drive the display module DM or a connector for a power supply. The main circuit board MB may be connected to the display module DM via the flexible circuit board CF.

According to an embodiment, the display module DM may be easily controlled by using one main circuit board MB, however, this is merely one example. In the display module DM according to an embodiment of the inventive concept, the display panel DP and the input sensing panel ISP may be connected to different main circuit boards, and they should not be limited to a particular embodiment.

The housing HU may be coupled to the window panel WP. The housing HU and the window panel WP coupled to the housing HU may provide a predetermined inner space. The display module DM may be accommodated in the inner space.

The housing HU may include a material with a relatively high rigidity. For example, the housing HU may include a glass, plastic, or metal material or a plurality of frames and/or plates of combinations thereof. The housing HU may stably protect the components of the display device EA accommodated in the inner space from external impacts.

Referring to FIG. 3A, the display module DM may include the display panel DP and the input sensing panel ISP.

The display panel DP may include a base layer BS, a circuit element layer ML-D, a display element layer EML, and a thin film encapsulation layer ECL.

The base layer BS may serve as a base layer on which the circuit element layer ML-D, the display element layer EML, the thin film encapsulation layer ECL, and the input sensing panel ISP are stacked. The base layer BS may be flexible or rigid and may have a single-layer or multi-layer structure, and it should not be particularly limited.

The circuit element layer ML-D may be disposed on the base layer BS. The circuit element layer ML-D may include a plurality of insulating layers, a plurality of conductive layers, and a semiconductor layer. The conductive layers of the circuit element layer ML-D may form signal lines or a control circuit of a pixel PX (refer to FIG. 4).

The display element layer EML may be disposed on the circuit element layer ML-D. The display element layer EML may include organic light emitting diodes, however, this is merely one example. According to an embodiment, the display element layer EML may include inorganic light emitting diodes, organic-inorganic light emitting diodes, or a liquid crystal layer.

The thin film encapsulation layer ECL may include an organic layer and a plurality of inorganic layers to encapsulate the organic layer. The thin film encapsulation layer ECL may encapsulate the display element layer EML to block moisture and oxygen from entering the display element layer EML.

The input sensing panel ISP may be disposed on the thin film encapsulation layer ECL. The input sensing panel ISP may be formed on the thin film encapsulation layer ECL through successive processes. In this case, the input sensing panel ISP may be described as being disposed directly on the display panel DP. The expression that the input sensing panel ISP is disposed directly on the display panel DP means that no other elements are disposed between the input sensing panel ISP and the display panel DP. That is, a separate adhesive member may not be disposed between the input sensing panel ISP and the display panel DP.

The input sensing panel ISP may sense the external input using one of a self-capacitance method and a mutual capacitance method. Sensing patterns included in the input sensing panel ISP may be arranged and connected in various ways in accordance with the sensing method.

According to the present embodiment, the input sensing panel ISP may sense the external input using the mutual capacitance method, and in this case, a layer having a high permittivity may be additionally applied to the conductive layer to improve the sensing sensitivity. Detailed descriptions of the input sensing panel ISP will be described later.

Referring to FIG. 3B, the display module DM-1 may include a display panel DP, an input sensing panel ISP, and an optical member POL.

The optical member POL may be disposed on the input sensing panel ISP to reduce a reflectance of the display panel DP with respect to the external light applied to the display panel DP. For example, the optical member POL may include at least one of an anti-reflective film, a polarization film, and a gray filter.

Referring to FIG. 3C, the display module DM-2 may include a display panel DP, an input sensing panel ISP, and an optical filter member OM.

The optical filter member OM may selectively transmit the light provided thereto from the display panel DP. The optical filter member OM may include a plurality of color filters and a light blocking pattern disposed between the color filters.

The color filters may selectively transmit a corresponding light among red, green, and blue lights. In this case, each of the color filters may include a polymer photoresist and a pigment or a dye.

In addition, the optical filter member OM may further include a planarization layer disposed on the color filters.

The planarization layer may be disposed on the color filters to cover concave-convex portions formed during processes of forming the color filters. Accordingly, components disposed on the optical filter member OM may be stably coupled with the optical filter member OM.

Figure 4:
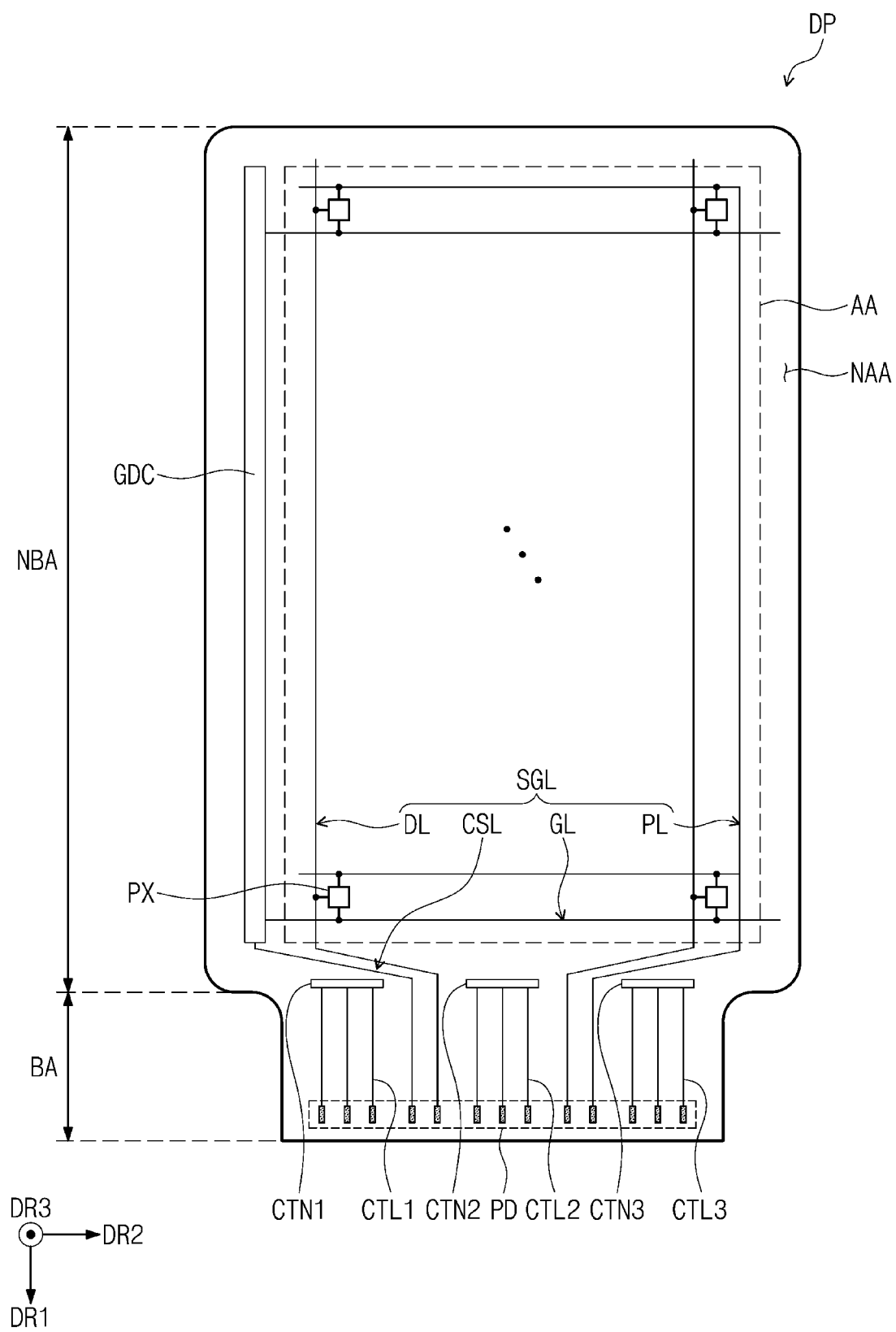
FIG. 4 is a plan view showing a display panel according to an embodiment of the present invention.
Figure 5A:
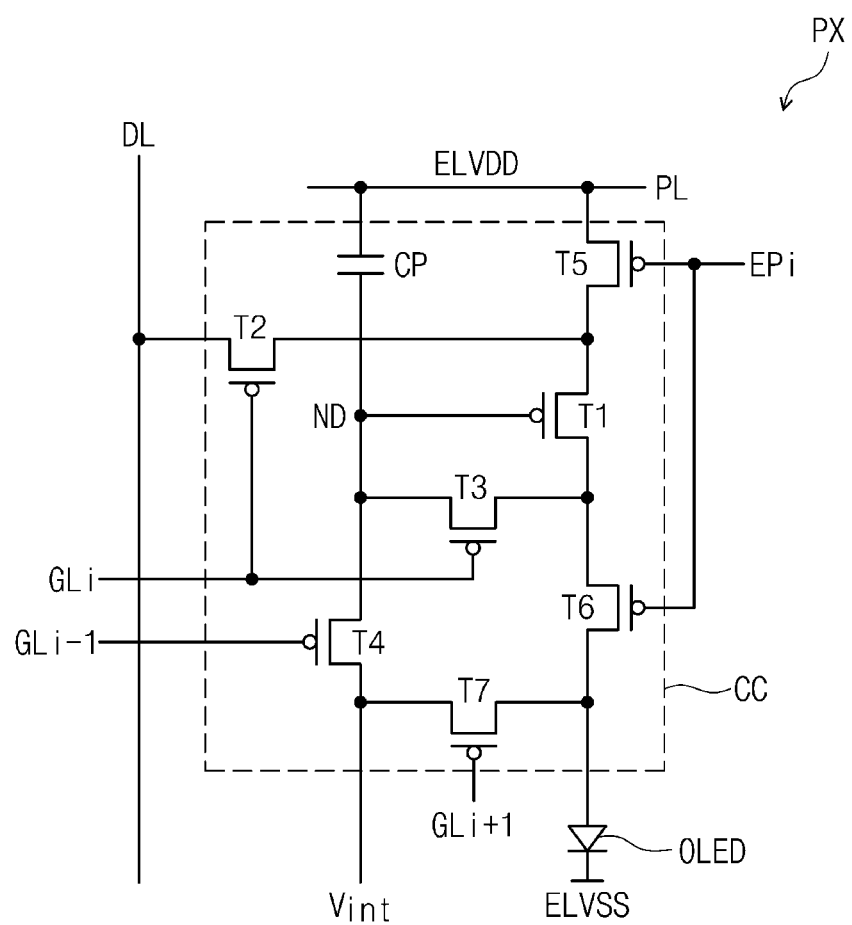
FIG. 5A is an equivalent circuit diagram showing a pixel according to an embodiment of the present invention.
Figure 5B:
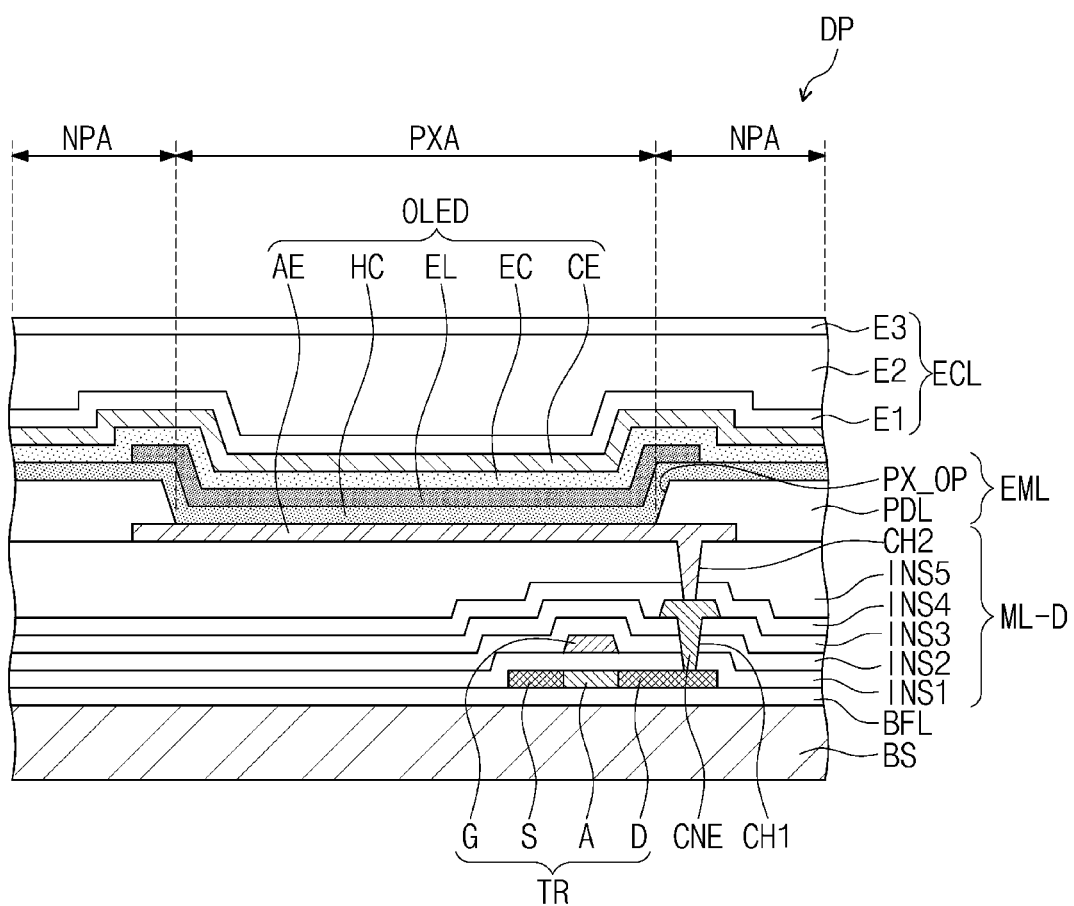
FIG. 5B is a cross-sectional view showing a display panel according to an embodiment of the present invention.

FIG. 4 is a plan view showing the display panel DP according to an embodiment of the present invention. FIG. 5A is an equivalent circuit diagram showing the pixel PX according to an embodiment of the present invention. FIG. 5B is a cross-sectional view showing the display panel DP according to an embodiment of the present invention.

Referring to FIG. 4, the display panel DP may include an active area AA and a peripheral area NAA. The active area AA of the display panel DP may be the area through which the image is displayed, and the peripheral area NAA of the display panel DP may be the area in which the driving circuit or the driving line is disposed. Light emitting elements of pixels PX may be disposed in the active area AA. The active area AA may overlap at least a portion of the transmissive area TA, and the peripheral area NAA may be covered by the bezel area BZA.

The display panel DP may include a driving circuit GDC, a plurality of signal lines SGL, the pixels PX, a plurality of lower contact holes CTN1, CTN2, and CTN3, a plurality of contact lines CTL1, CTL2, and CTL3, and a plurality of pads PD, each of which may be connected to a corresponding contact line among the contact lines CTL1, CTL2, and CTL3.

Each of the pixels PX may include the light emitting element and a plurality of transistors connected to the light emitting element. The pixels PX may emit a light in response to an electrical signal applied thereto.

The signal lines SGL may include scan lines GL, data lines DL, a power line PL, and a control signal line CSL. Each of the scan lines GL may be connected to a corresponding pixel among the pixels PX. Each of the data lines DL may be connected to a corresponding pixel among the pixels PX. The power line PL may be connected to the pixels PX and may provide a power source voltage to the pixels PX. The control signal line CSL may apply control signals to a scan driving circuit.

The driving circuit GDC may be disposed in the peripheral area NAA. The driving circuit GDC may include the scan driving circuit. The scan driving circuit may generate scan signals and may sequentially output the scan signals to the scan lines GL. The scan driving circuit may further output another control signal to the driving circuit of the pixels PX.

The scan driving circuit may include a plurality of thin film transistors that are formed through the same process as the driving circuit of the pixels PX, for instance, a low temperature polycrystalline silicon (LTPS) process or a low temperature polycrystalline oxide (LTPO) process.

The display panel DP may include a bending area BA and a non-bending area NBA adjacent to the bending area BA. The bending area BA of the display panel DP may be an area that is bent toward a rear surface of the display panel DP together with the flexible circuit board CF described with reference to FIG. 2 and attached to the bending area BA. Accordingly, the flexible circuit board CF and the main circuit board MB may be disposed on the rear surface of the display panel DP while being attached to the bending area BA of the display panel DP. Data lines DL and other signal lines CSL, GL, and PL may extend to the bending area BA from the non-bending area NBA and may be connected to corresponding pads PD.

According to an embodiment, a width in the second direction DR2 of the display panel DP may be greater in the non-bending area NBA than in the bending area BA.

The display panel DP may include the lower contact holes CTN1, CTN2, and CTN3 defined in the peripheral area NAA. The lower contact holes CTN1, CTN2, and CTN3 may overlap upper contact holes CTN-1, CTN-2, and CTN-3 of the input sensing panel ISP to be described later.

The contact lines CTL1, CTL2, and CTL3 may extend to the bending area BA from the lower contact holes CTN1, CTN2, and CTN3 and may be connected to corresponding pads PD.

One end of each of first contact lines CTL1 may extend from a corresponding first lower contact hole CTN1, and the other end of each of the first contact lines CTL1 may be connected to a corresponding pad PD.

One end of each of second contact lines CTL2 may extend from a corresponding second lower contact hole CTN2, and the other end of each of the second contact lines CTL2 may be connected to a corresponding pad PD.

One end of each of third contact lines CTL3 may extend from a corresponding third lower contact hole CTN3, and the other end of each of the third contact lines CTL3 may be connected to a corresponding pad PD.

FIG. 4 shows three lower contact holes CTN1, CTN2, and CTN3, however, this is merely a representative example of an arrangement of the lower contact holes. The arrangement and the number of the lower contact holes should not be particularly limited as long as the lower contact holes overlap the upper contact holes of the input sensing panel ISP.

FIG. 5A is an enlarged circuit diagram of one pixel PX among the pixels as a representative example. FIG. 5A shows the pixel PX connected to an i-th scan line GLi and an i-th light emitting control line EPi.

The pixel PX may include a light emitting element OLED and a pixel circuit CC. The pixel circuit CC may include a plurality of transistors T1 to T7 and a capacitor CP. The transistors T1 to T7 may be formed through the low temperature polycrystalline silicon (LTPS) process or the low temperature polycrystalline oxide (LTPO) process.

The pixel circuit CC may control an amount of current flowing through the light emitting element OLED in response to a data signal. The light emitting element OLED may emit a light at a predetermined luminance in response to the amount of the current provided from the pixel circuit CC. To this end, a first power voltage ELVDD may have a level that is set higher than a level of a second power voltage ELVSS.

Each of the transistors T1 to T7 may include an input electrode (or a source electrode), an output electrode (or a drain electrode), and a control electrode (or a gate electrode). In the following descriptions, for the convenience of explanation, one electrode of the input electrode and the output electrode may be referred to as a first electrode, and the other electrode of the input electrode and the output electrode may be referred to as a second electrode.

A first electrode of a first transistor T1 may be connected to the first power voltage ELVDD via a fifth transistor T5, and a second electrode of the first transistor T1 may be connected to an anode electrode (a first electrode) of the light emitting element OLED via a sixth transistor T6. The first transistor T1 may be referred to as a driving transistor in the present invention.

The first transistor T1 may control the amount of the current flowing through the light emitting element OLED in response to a voltage applied to a control electrode of the first transistor T1.

A second transistor T2 may be connected between the data line DL and the first electrode of the first transistor T1. A control electrode of the second transistor T2 may be connected to the i-th scan line GLi. When an i-th scan signal is applied to the i-th scan line GLi, the second transistor T2 may be turned on and may electrically connect the data line DL to the first electrode of the first transistor T1.

A third transistor T3 may be connected between the second electrode of the first transistor T1 and the control electrode of the first transistor T1. A control electrode of the third transistor T3 may be connected to the i-th scan line GLi. When the i-th scan signal is applied to the i-th scan line GLi, the third transistor T3 may be turned on and may electrically connect the second electrode of the first transistor T1 to the control electrode of the first transistor T1. Accordingly, when the third transistor T3 is turned on, the first transistor T1 may be connected in a diode configuration.

A fourth transistor T4 may be connected between a node ND and an initialization power generator (not shown). A control electrode of the fourth transistor T4 may be connected to an (i−1)th scan line GLi−1. When an (i−1)th scan signal is applied to the (i−1)th scan line GLi−1, the fourth transistor T4 may be turned on and may provide an initialization voltage Vint to the node ND.

The fifth transistor T5 may be connected between the power line PL and the first electrode of the first transistor T1. A control electrode of the fifth transistor T5 may be connected to the i-th light emitting control line EPi.

The sixth transistor T6 may be connected between the second electrode of the first transistor T1 and the anode electrode (the first electrode) of the light emitting element OLED. A control electrode of the sixth transistor T6 may be connected to the i-th light emitting control line EPi.

A seventh transistor T7 may be connected between the initialization power generator (not shown) and the anode electrode of the light emitting element OLED. A control electrode of the seventh transistor T7 may be connected to an (i+1)th scan line GLi+1. When an (i+1)th scan signal is applied to the (i+1)th scan line GLi+1, the seventh transistor T7 may be turned on and may provide the initialization voltage Vint to the anode electrode of the light emitting element OLED.

The seventh transistor T7 may improve a black expression capability. In detail, when the seventh transistor T7 is turned on, a parasitic capacitor (not shown) of the light emitting element OLED may be discharged. Accordingly, when implementing a black luminance, the light emitting element OLED does not emit the light even though a leakage current occurs from the first transistor T1, and thus, the black expression ability may be improved.

In FIG. 5A, the control electrode of the seventh transistor T7 is connected to the (i+1)th scan line GLi+1, however, the inventive concept should not be limited thereto or thereby. According to an embodiment, the control electrode of the seventh transistor T7 may be connected to the i-th scan line GLi or the (i−1)th scan line GLi−1.

The capacitor CP may be disposed between the power line PL and the node ND. The capacitor CP may be charged with a voltage corresponding to the data signal. When the fifth and sixth transistors T5 and T6 are turned on, the amount of the current flowing through the first transistor T1 may be determined by the voltage charged in the capacitor CP.

In the present embodiment, the equivalent circuit of the pixel PX should not be limited to the equivalent circuit shown in FIG. 5A. According to an embodiment, the pixel PX may be implemented in various ways to allow the light emitting element OLED to emit the light. FIG. 5A shows a PMOS as a representative example of the transistors of the pixel circuit CC, however, the inventive concept should not be limited thereto or thereby. According to an embodiment, the pixel circuit CC may be implemented by an NMOS. According to an embodiment, the pixel circuit CC may be implemented by a combination of the NMOS and the PMOS.

Referring to FIG. 5B, the display panel DP may include a base layer BS, a plurality of insulating layers BFL, INS1 to INS5, and PDL, and the thin film encapsulation layer ECL.

The base layer BS may include a flexible plastic substrate. As an example, the base layer BS may include a transparent polyimide (PI) material. A buffer layer BFL may be disposed on the base layer BS, and the buffer layer BFL may be an inorganic layer. A semiconductor pattern may be disposed on the buffer layer BFL. The semiconductor pattern may include polysilicon, however, the inventive concept should not be limited thereto or thereby. According to an embodiment, the semiconductor pattern may include amorphous silicon or metal oxide.

The semiconductor pattern may be doped with an N-type dopant or a P-type dopant. The semiconductor pattern may have different electrical properties depending on whether it is doped or not or whether it is doped with the N-type dopant or the P-type dopant. The semiconductor pattern may include a high doped region and a low doped region. The high doped region may have a conductivity higher than that of the low doped region and may serve as a source electrode and a drain electrode of a transistor TR. The low doped region may correspond to an active region (or a channel) of the transistor TR.

The source electrode S, the active region A, and the drain electrode D of the transistor TR may be formed from the semiconductor pattern. A first insulating layer INS1 may be disposed on the semiconductor pattern. The gate electrode G of the transistor TR may be disposed on the first insulating layer INS1. A second insulating layer INS2 may be disposed on the gate electrode G. A third insulating layer INS3 may be disposed on the second insulating layer INS2. The transistor TR shown in FIG. 5B may correspond to the sixth transistor T6 among the transistors T1 to T7 described with reference to FIG. 5A.

A connection electrode CNE may be disposed between the transistor TR and the light emitting element OLED and may connect the transistor TR to the light emitting element OLED. The connection electrode CNE may be disposed on the third insulating layer INS3 and may be connected to the drain electrode D via a first contact hole CH1 defined through the first to third insulating layers INS1 to INS3, however, the inventive concept should not be limited thereto or thereby. According to an embodiment, in a case where insulating layers are additionally disposed on and under the connection electrode CNE, additional connection electrodes may be further disposed to be connected to the connection electrode CNE after penetrating through the added insulating layers, or the first electrode AE of the light emitting element OLED may be directly connected to the drain electrode D without forming the connection electrode CNE, and the inventive concept should not be particularly limited.

A fourth insulating layer INS4 may be disposed on the connection electrode CNE. A fifth insulating layer INS5 may be disposed on the fourth insulating layer INS4. The first insulating layer INS1 to the fourth insulating layer INS4 may be inorganic layers, and the fifth insulating layer INS5 may be an organic layer.

The first electrode AE may be disposed on the fifth insulating layer INS5. The first electrode AE may be connected to the connection electrode CNE via a second contact hole CH2 defined through the fifth insulating layer INS5. A pixel defining layer PDL may be disposed on the first electrode AE and the fifth insulating layer INS5 to expose a portion of the first electrode AE. The pixel defining layer PDL may be provided with an opening PX_OP to expose the portion of the first electrode AE. The portion of the first electrode AE, which is exposed through the opening PX_OP, may be defined as a light emitting area PXA, and a non-light-emitting area NPA may be defined adjacent to the light emitting area PXA.

The hole control layer HC may be disposed on the first electrode AE and the pixel defining layer PDL. The hole control layer HC may be commonly disposed over the light emitting area PXA and the non-light-emitting area NPA. The hole control layer HC may include a hole transport layer and a hole injection layer.

The light emitting layer EL may be disposed on the hole control layer HC. The light emitting layer EL may be disposed in an area corresponding to the opening PX_OP. The light emitting layer EL may include an organic material and/or an inorganic material. The light emitting layer EL may emit a light having one of red, green, and blue colors.

An electron control layer EC may be disposed on the light emitting layer EL and the hole control layer HC. The electron control layer EC may be commonly disposed over the light emitting area PXA and the non-light-emitting area NPA. The electron control layer EC may include an electron transport layer and an electron injection layer.

A second electrode CE may be disposed on the electron control layer EC. The second electrode CE may be commonly disposed over the pixels PX. Layers from the buffer layer BFL to the light emitting element OLED may be defined as a "pixel layer".

The thin film encapsulation layer ECL may be disposed on the light emitting element OLED to cover the light emitting element OLED. The thin film encapsulation layer ECL may include a first inorganic encapsulation layer E1 disposed on the pixel PX, a second inorganic encapsulation layer E3 disposed on the first inorganic encapsulation layer E1, and an organic encapsulation layer E2 disposed between the first and second inorganic encapsulation layers E1 and E3.

The first and second inorganic encapsulation layers E1 and E3 may include an inorganic material and may protect the pixels from moisture and oxygen. The organic encapsulation layer E2 may include an organic material and may protect the pixels PX from a foreign substance, such as dust particles. The organic encapsulation layer E2 may be formed through a solution process such as a spin coating process, a slit coating process, and an inkjet process.

The lower contact holes CTN1, CTN2, and CTN3 described with reference to FIG. 4 may be formed through at least one of the insulating layers included in the circuit element layer ML-D, the display element layer EML, and the thin film encapsulation layer ECL, and the contact lines CTL1, CTL2, and CTL3 (refer to FIG. 4) may be disposed on the same layer as one of the conductive patterns included in the buffer layer BFL and the first to third insulating layers INS1 to INS3 and may extend to the bending area BA (refer to FIG. 4).

Figure 6:
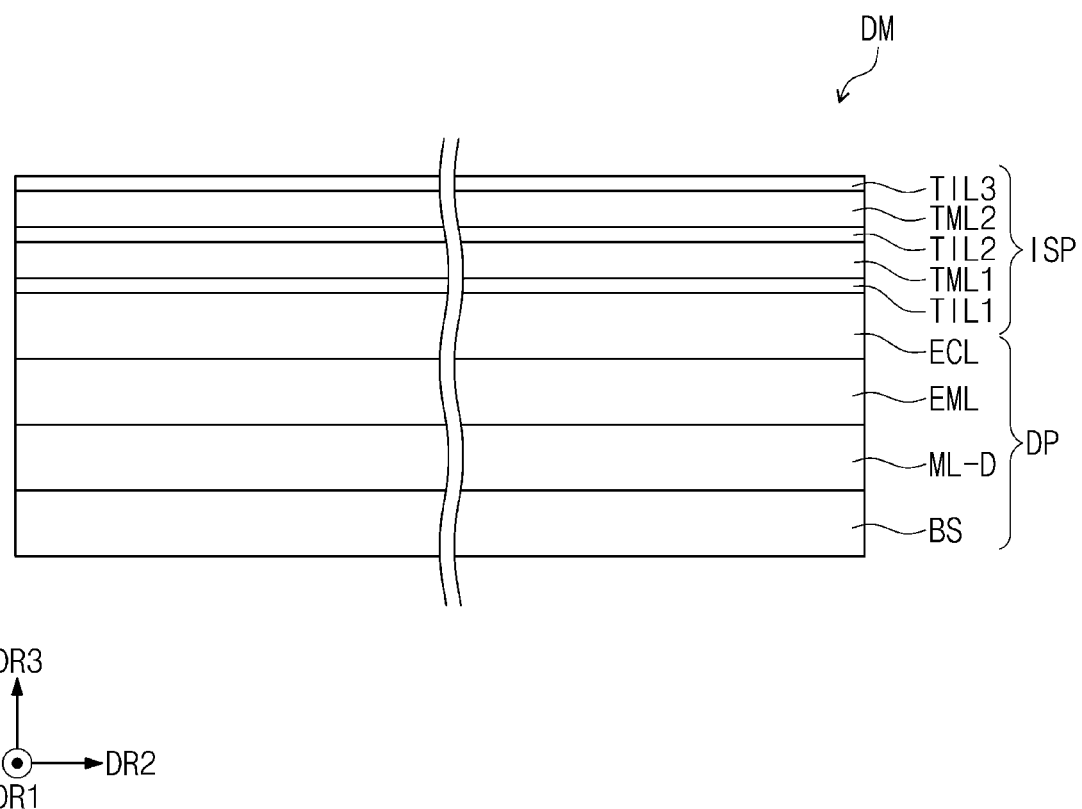
FIG. 6 is a cross-sectional view showing a display module according to an embodiment of the present invention.
Figure 7:
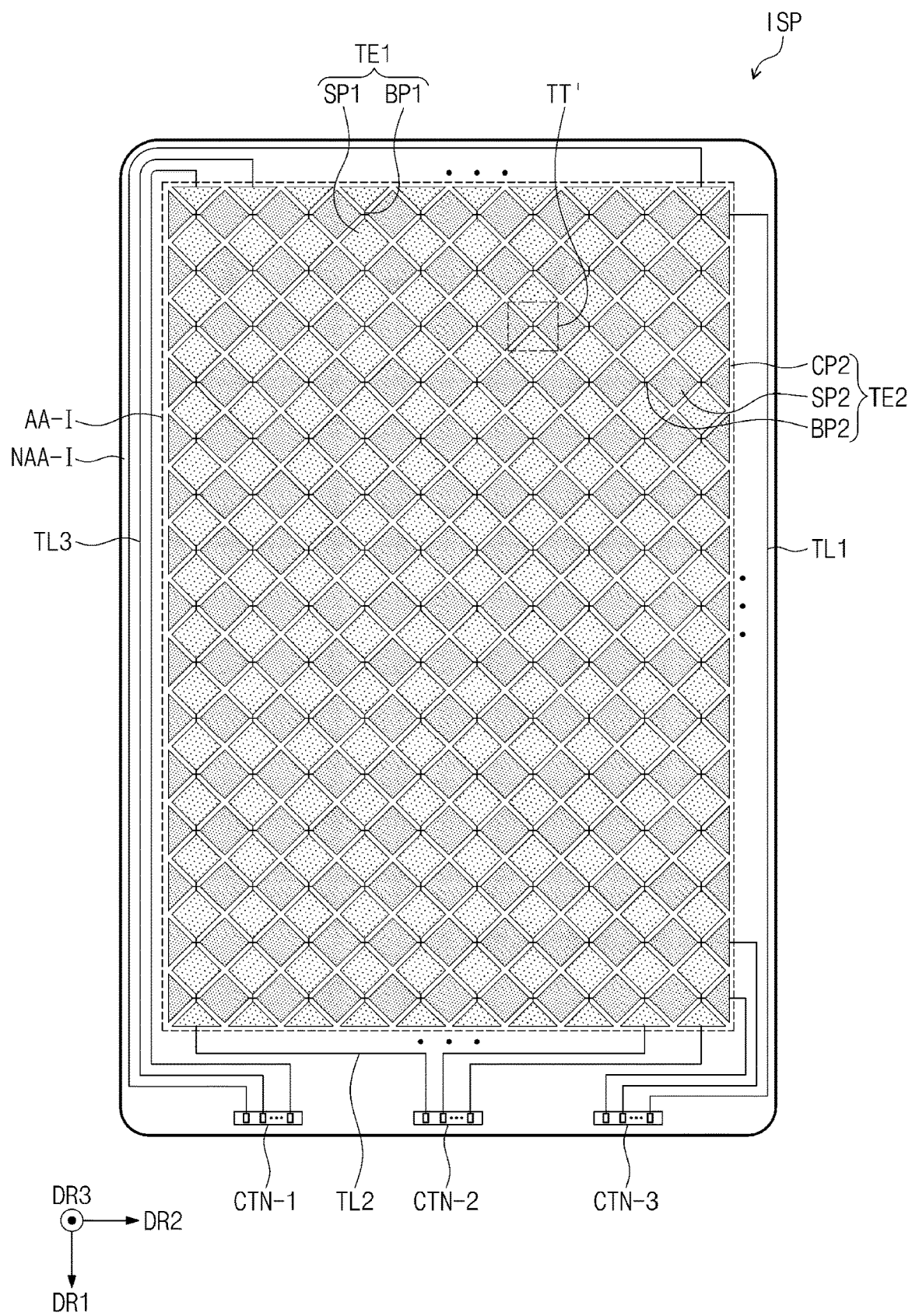
FIG. 7 is a plan view showing an input sensing panel according to an embodiment of the present invention.
Figure 8:
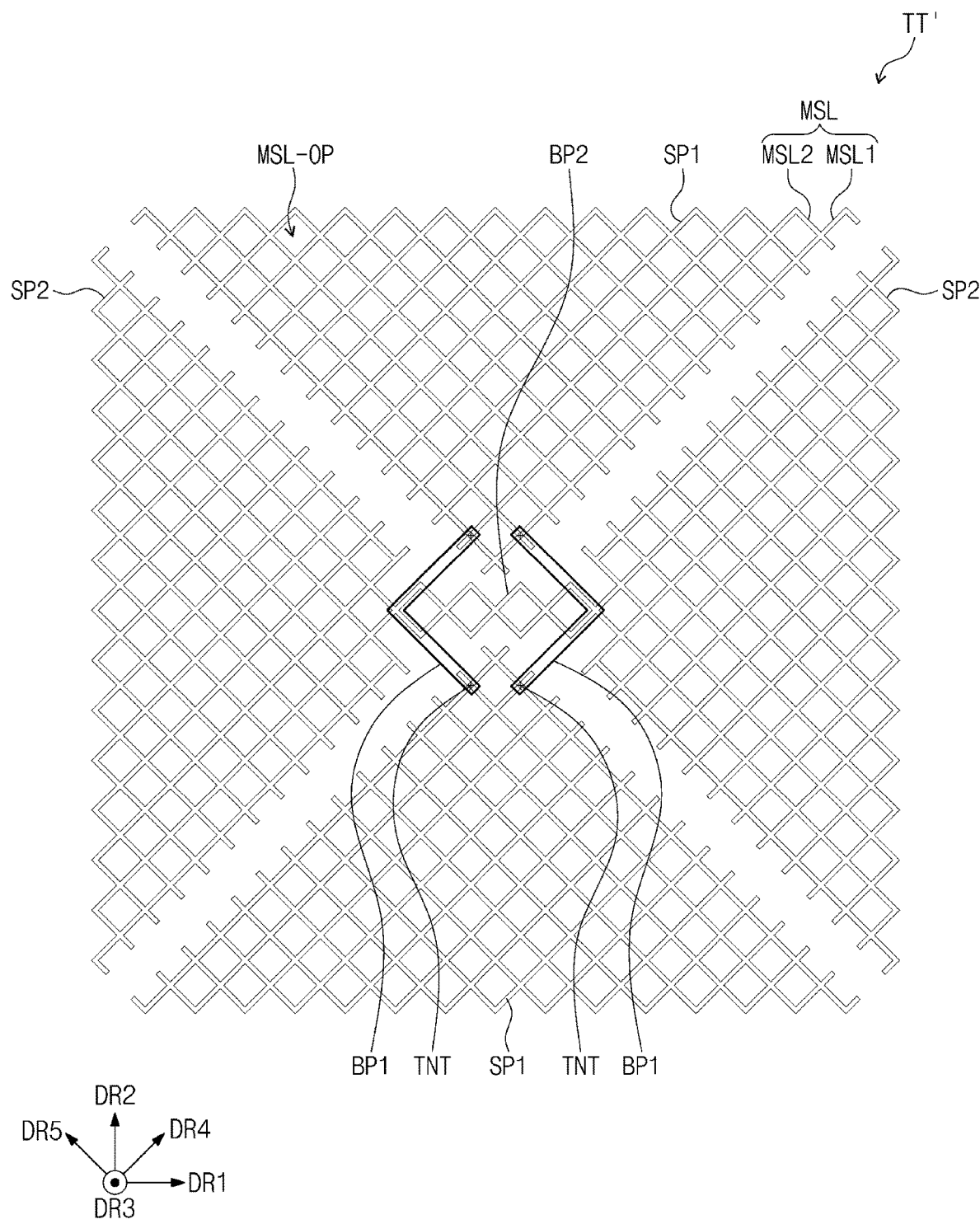
FIG. 8 is an enlarged plan view showing an area TT' shown in FIG. 7.
Figure 9:
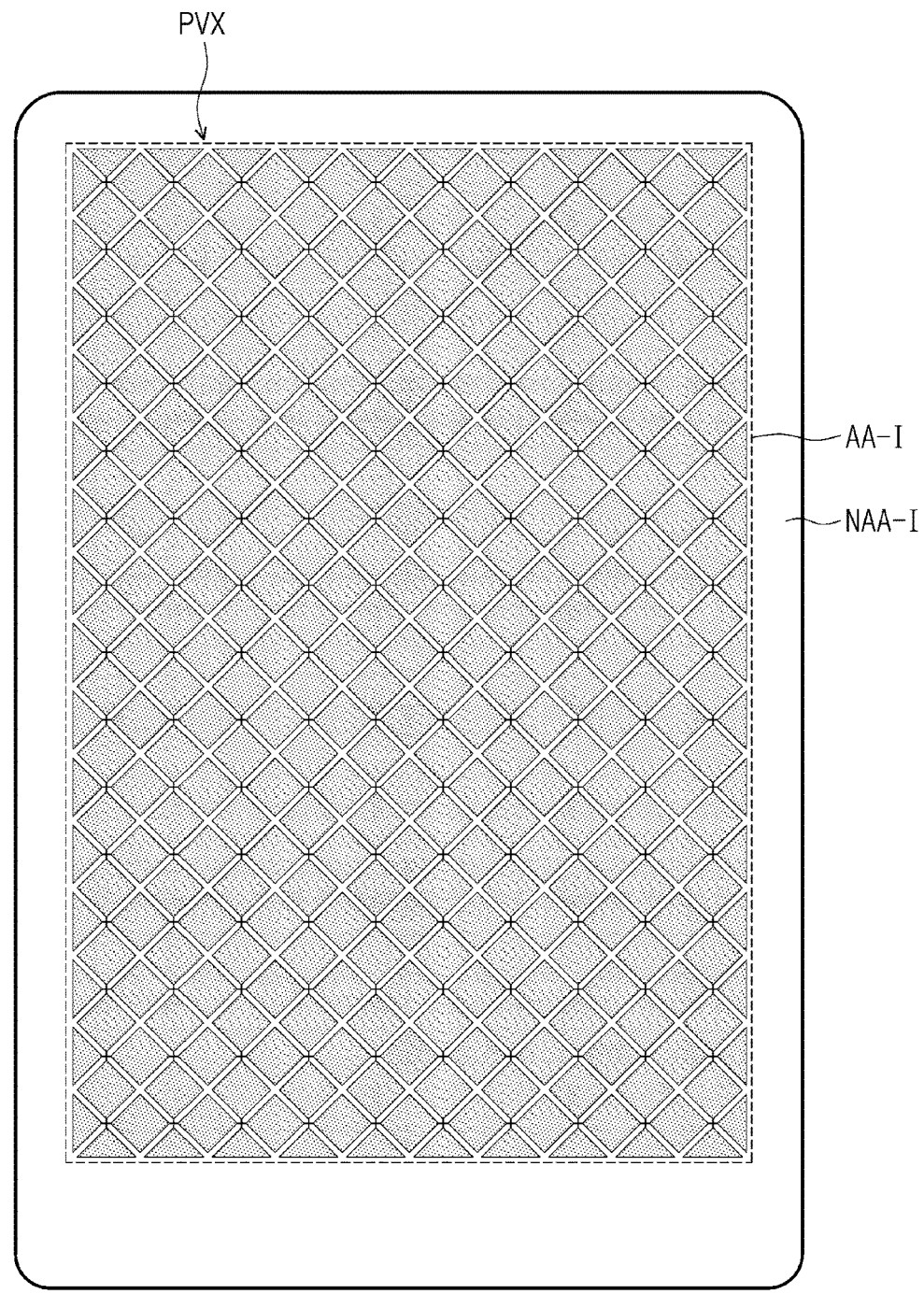
FIG. 9 is a plan view showing a passivation layer according to an embodiment of the present invention.
Figure 9:
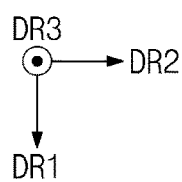

FIG. 6 is a cross-sectional view showing the display module DM according to an embodiment of the present invention. FIG. 7 is a plan view showing the input sensing panel ISP according to an embodiment of the present invention. FIG. 8 is an enlarged plan view showing an area TT' shown in FIG. 7. FIG. 9 is a plan view showing a passivation layer PVX according to an embodiment of the present invention.

The display module DM may include the display panel DP and the input sensing panel ISP, and details on the display panel DP described with reference to FIG. 5B may be applied to the display panel DP of FIG. 6.

The input sensing panel ISP may include a first sensing insulating layer TIL1, a first conductive layer TML1, a second sensing insulating layer TIL2, a second conductive layer TML2, and a third sensing insulating layer TIL3. The first sensing insulating layer TIL1 of the input sensing panel ISP may be disposed directly on the thin film encapsulation layer ECL. The first sensing insulating layer TIL1 of the input sensing panel ISP may be omitted.

Each of the first conductive layer TML1 and the second conductive layer TML2 may have a single-layer structure or a multi-layer structure. The conductive layer having the multi-layer structure may include two or more layers of a transparent conductive layer and a metal layer. The conductive layer having the multi-layer structure may include metal layers containing different metals from each other.

The first and second conductive layers TML1 and TML2 may be a transparent conductive layer and may include at least one of indium tin oxide (ITO), indium zinc oxide (IZO), zinc oxide (ZnO), indium tin zinc oxide (ITZO), PEDOT, metal nanowire, and graphene. The first and second conductive layers TML1 and TML2 may be the metal layer and may include molybdenum, silver, titanium, copper, aluminum, and alloys thereof.

Each of the first and second conductive layers TML1 and TML2 may have a three-layer structure of titanium/aluminum/titanium. Metals with a relatively high durability and a low reflectance may be applied as an outer layer of the conductive layer, and metals with a high electrical conductivity may be applied as an inner layer of the conductive layer.

Each of the first, second, and third sensing insulating layers TIL1, TIL2, and TIL3 may include an inorganic layer or an organic layer. According to an embodiment, each of the first and second sensing insulating layers TIL1 and TIL2 may include the inorganic layer. The inorganic layer may include at least one of aluminum oxide, titanium oxide, silicon oxide, silicon oxynitride, zirconium oxide, and hafnium oxide.

The third sensing insulating layer TIL3 may include the organic layer. The organic layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyimide-based resin, a polyamide-based resin, and a perylene-based resin.

Although not shown in FIG. 6, the input sensing panel ISP may further include a high permittivity layer disposed on the second conductive layer TML2 and covered by the third sensing insulating layer TIL3. The high permittivity layer may have a high permittivity as compared with that of the third sensing insulating layer TIL3. Detailed descriptions of the high permittivity layer will be described later.

Referring to FIG. 7, the input sensing panel ISP may include a plurality of sensing electrodes TE1 and TE2 and a plurality of sensing lines TL1, TL2, and TL3.

The input sensing panel ISP may include an active area AA-I and a peripheral area NAA-I adjacent to the active area AA-I. The active area AA-I and the peripheral area NAA-I of the input sensing panel ISP may correspond to the active area AA and the peripheral area NAA of the display panel DP, respectively.

The sensing electrodes TE1 and TE2 may include a first sensing electrode TE1 and a second sensing electrode TE2.

The first sensing electrode TE1 may extend in the first direction DR1 and may be provided in plural, and the first sensing electrodes TE1 may be arranged in the second direction DR2. The first sensing electrode TE1 may include first sensing patterns SP1 and first conductive patterns BP1. The first sensing patterns SP1 may be arranged in the first direction DR1. At least one first conductive pattern BP1 may be connected to two first sensing patterns SP1 adjacent to each other.

The second sensing electrode TE2 may extend in the second direction DR2 and may be provided in plural, and the second sensing electrodes TE2 may be arranged in the first direction DR1. The second sensing electrode TE2 may include second sensing patterns SP2 and second conductive patterns BP2. The second sensing patterns SP2 and the second conductive patterns BP2 may be patterned through the same process and may be provided integrally with each other, however, for the convenience of explanation, the patterns will be described separately as the second sensing patterns SP2 and the second conductive patterns BP2.

The second sensing patterns SP2 may be arranged in the second direction DR2. At least one second conductive pattern BP2 may be disposed between two second sensing patterns SP2 adjacent to each other.

The sensing lines TL1, TL2, and TL3 may include a first sensing line TL1, a second sensing line TL2, and a third sensing line TL3.

The input sensing panel ISP may include the upper contact holes CTN-1, CTN-2, and CTN-3 defined in the peripheral area NAA-I. The upper contact holes CTN-1, CTN-2, and CTN-3 may be formed through the first sensing insulating layer TIL1 and the second sensing insulating layer TIL2. The upper contact holes CTN-1, CTN-2, and CTN-3 may overlap the lower contact holes CTN1, CTN2, and CTN3 (refer to FIG. 4), respectively.

One end of the first sensing line TL1 may be connected to the second sensing electrode TE2, and the other end of the first sensing line TL1 may extend to a third upper contact hole CTN-3. The other end of the first sensing line TL1 may be connected to the third contact line CTL3 (refer to FIG. 4) via the third lower contact hole CTN3 (refer to FIG. 4) and the third upper contact hole CTN-3 overlapping the third lower contact hole CTN3 (refer to FIG. 4).

One end of the second sensing line TL2 may be connected to the one end of the first sensing electrode TE1, and the other end of the second sensing line TL2 may extend to a second upper contact hole CTN-2. The other end of the second sensing line TL2 may be connected to the second contact line CTL2 (refer to FIG. 4) via the second lower contact hole CTN2 (refer to FIG. 4) and the second upper contact hole CTN-2 overlapping the second lower contact hole CTN2 (refer to FIG. 4).

One end of the third sensing line TL3 may be connected to the other end of the first sensing electrode TE1, and the other end of the third sensing line TL3 may extend to a first upper contact hole CTN-1. The other end of the third sensing line TL3 may be connected to the first contact line CTL1 (refer to FIG. 4) via the first lower contact hole CTN1 (refer to FIG. 4) and the first upper contact hole CTN-1 overlapping the first lower contact hole CTN1 (refer to FIG. 4).

According to an embodiment, the first sensing electrode TE1 may be connected to the second sensing line TL2 and the third sensing line TL3. Accordingly, the first sensing electrode TE1 having a relatively longer length than that of the second sensing electrode TE2 may have uniform sensitivity for the entire area thereof.

The contact lines CTL1, CTL2, and CTL3 may be connected to corresponding pads PD and thus may be connected to the pads of the flexible circuit board CF. Accordingly, the sensing electrodes TE1 and TE2 may be electrically connected to the flexible circuit board CF connected to the bending area BA of the display panel DP and the main circuit board MB.

However, according to an embodiment, only one of the one end and the other end of the first sensing electrode TE1 may be connected to the sensing line, and in this case, one of the first and second upper contact holes CTN-1 and CTN-2 may be omitted.

FIG. 8 is a plan view showing an arrangement of the first sensing patterns SP1, the first conductive patterns BP1, the second sensing patterns SP2, and the second conductive patterns BP2. In FIG. 8, the sensing insulating layers TIL1, TIL2, and TIL3 and the passivation layer PVX, which will be described later, are not illustrated.

According the present embodiment, the first sensing patterns SP1 and the second sensing electrode TE2 may include a mesh line MSL. The mesh line MSL may include a first mesh line MSL1 extending in a fourth direction DR4 and a second mesh line MSL2 extending in a fifth direction DR5.

The first and second mesh lines MSL1 and MSL2 may not overlap the light emitting area PXA described with reference to FIG. 5B and may overlap the non-light-emitting area NPA described with reference to FIG. 5B. The first and second mesh lines MSL1 and MSL2 may define a plurality of mesh openings MSL-OP. The first and second mesh lines MSL1 and MSL2 may have a line width of several nanometers to several micrometers. The mesh openings MSL-OP may correspond to the light emitting area PXA defined in every pixel PX in a one-to-one correspondence.

According to the present embodiment, the first sensing pattern SP1 and the second sensing electrode TE2 may form the second conductive layer TML2 described with reference to FIG. 6.

The first sensing patterns SP1 may be connected to a corresponding first conductive pattern BP1 via a sensing contact hole TNT defined through the second sensing insulating layer TIL2. Accordingly, although the first sensing patterns SP1 are disposed on the same layer as the second sensing electrode TE2, the first sensing patterns SP1 may be disposed to be insulated from the second sensing electrode TE2 due to the first conductive pattern BP1 disposed on the first sensing insulating layer TIL1. Accordingly, the first conductive pattern BP1 and the second conductive pattern BP2, which are disposed on different layers from each other, may overlap each other when viewed in a plan view.

A portion of each of the sensing lines TL1, TL2, and TL3 may be included in the first conductive layer TML1, and the other portion of each of the sensing lines TL1, TL2, and TL3 may be included in the second conductive layer TML2. Lines disposed on different layers from each other may be connected to each other via contact holes defined through the second sensing insulating layer TIL2, however, the inventive concept should not be limited thereto or thereby. According to an embodiment, the sensing lines TL1, TL2, and TL3 may be included in only one layer of the first conductive layer TML1 and the second conductive layer TML2.

Referring to FIG. 9, the input sensing panel ISP may include the passivation layer PVX. The passivation layer PVX may be disposed on the second conductive layer TML2. According to the present embodiment, the passivation layer PVX may be disposed directly on the first sensing patterns SP1 and the second sensing electrode TE2 of the second conductive layer TML2 overlapping the active area AA-I. Accordingly, the passivation layer PVX may not overlap the peripheral area NAA.

In the present embodiment, the passivation layer PVX may have a shape corresponding to the patterns included in the second conductive layer TML2 when viewed in a plan view. In the present disclosure, the expression "one component has a shape corresponding to that of another component" does not only mean that the two components have exactly the same shape with each other, and the expression may mean that one component disposed on one layer may have a shape overlapping another component disposed on another layer when viewed in a plan view. As an example, even when one of the components is entirely covered or partially exposed, it may be expressed that the shapes of the two components correspond to each other. In addition, when components/layers are patterned using the same mask in patterning processes, it may be expressed that the components/layers have the corresponding shape even though there exist a process error caused by a difference in etch rate with respect to an etchant.

The passivation layer PVX may have the shape corresponding to the first sensing patterns SP1, the second sensing patterns SP2, and the second conductive pattern BP2 when viewed in a plan view. That is, the passivation layer PVX may be patterned through the same process as the first sensing patterns SP1, the second sensing patterns SP2, and the second conductive pattern BP2, which are disposed on the second conductive layer TML2, using the same mask, and thus, the passivation layer PVX may have the corresponding shape to the first sensing patterns SP1, the second sensing patterns SP2, and the second conductive pattern BP2, which are disposed on the second conductive layer TML2, in a plane.

According to the present embodiment, the passivation layer PVX may have a permittivity higher than a permittivity of the third sensing insulating layer TIL3 covering the passivation layer PVX. As an example, the permittivity of the third sensing insulating layer TIL3 may be within a range from about 2.6 to about 3.5, and the permittivity of the passivation layer PVX may be within a range from about 3.75 to about 7.

The passivation layer PVX may have a thickness less than a thickness of the third sensing insulating layer TIL3 covering the passivation layer PVX. As an example, the thickness of the third sensing insulating layer TIL3 may be about 1.25 um, and the thickness of the passivation layer PVX may be about 0.5 um.

The passivation layer PVX may include a material different from that of the third sensing insulating layer TIL3 covering the passivation layer PVX. As an example, the passivation layer PVX may include an inorganic material. The inorganic material may include one of silicon nitride, silicon oxide, and silicon oxynitride. The third sensing insulating layer TIL3 may include an acrylic-based organic material.

The passivation layer PVX may increase a variation in capacitance between the sensing electrodes TE1 and TE2 when the input sensing panel ISP senses the external input using the mutual capacitance method.

That is, because the passivation layer PVX having a permittivity higher than that of the third sensing insulating layer TIL3 is disposed between the second conductive layer TML2 and the third sensing insulating layer TIL3, the variation in capacitance between the sensing electrodes TE1 and TE2 and the external input may increase. Accordingly, the sensing sensitivity of the display device EA may be improved.

Figure 10:
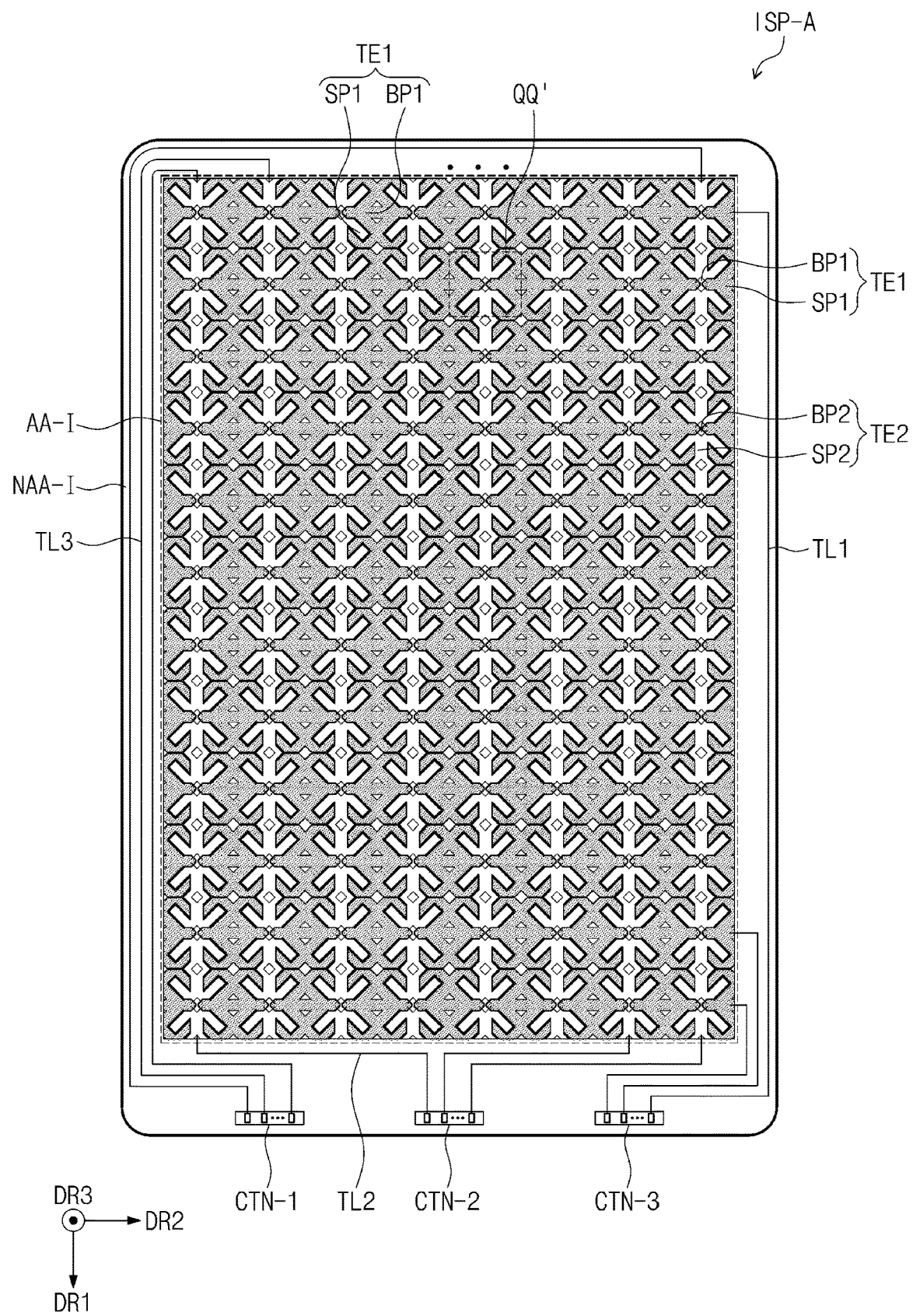
FIG. 10 is a plan view showing an input sensing panel according to an embodiment of the present invention.
Figure 11:
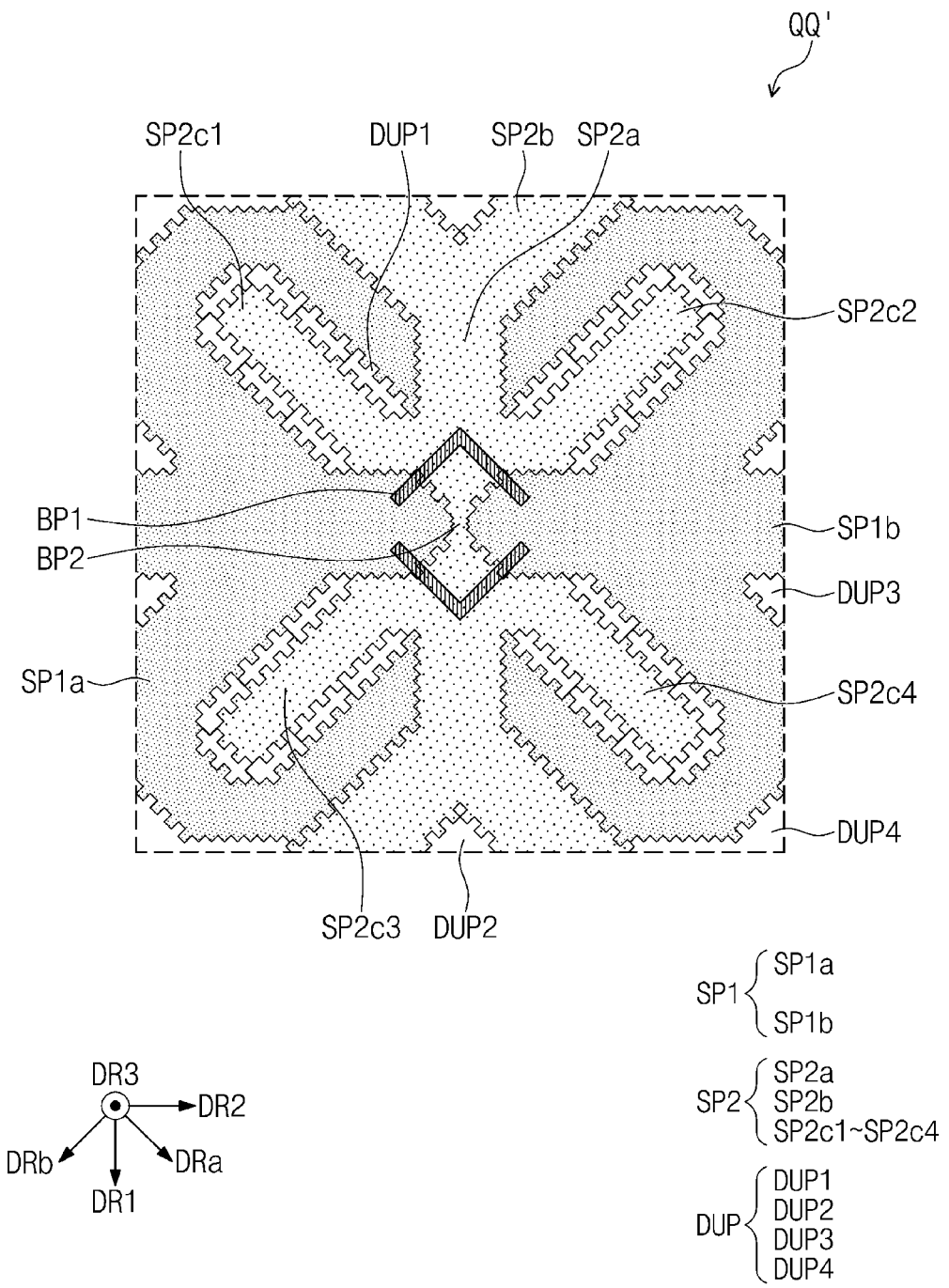
FIG. 11 is an enlarged plan view showing an area QQ' shown in FIG. 10.
Figure 12:
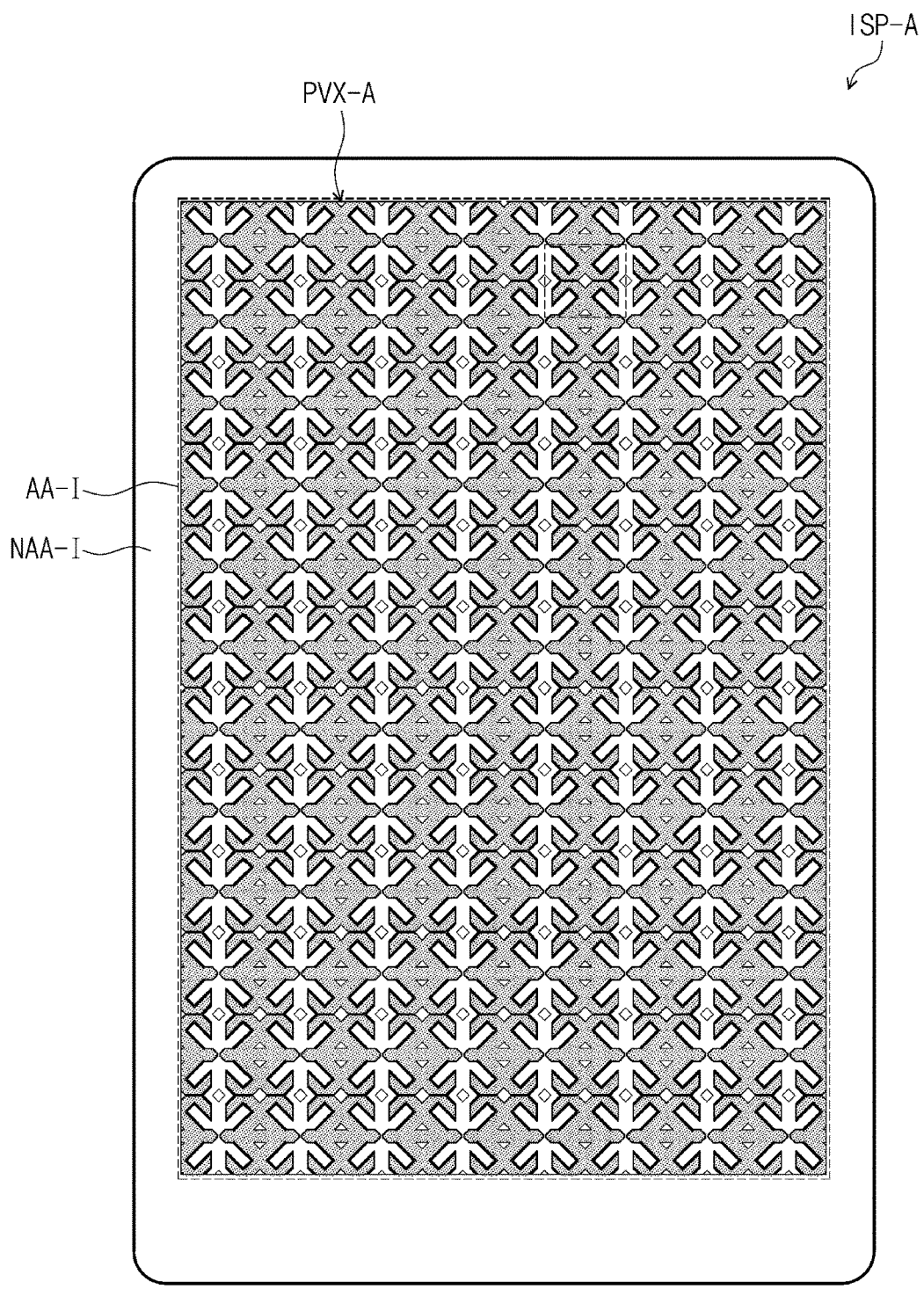
FIG. 12 is a plan view showing a passivation layer according to an embodiment of the present invention.
Figure 12:
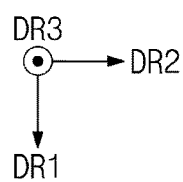

FIG. 10 is a plan view showing an input sensing panel ISP-A according to an embodiment of the present invention. FIG. 11 is an enlarged plan view showing an area QQ' shown in FIG. 10. FIG. 12 is a plan view showing a passivation layer PVX-A according to an embodiment of the present invention. In FIGS. 10 to 12, the same/similar reference numerals denote the same/similar elements in FIGS. 6 to 9, and thus, detailed descriptions of the same/similar elements will be omitted.

Referring to FIGS. 10 and 11, the input sensing panel ISP-A may include a first sensing electrode TE1 and a second sensing electrode TE2.

The first sensing electrode TE1 may extend in the second direction DR2 and may be provided in plural, and the first sensing electrodes TE1 may be arranged in the first direction DR1. The first sensing electrode TE1 may include first sensing patterns SP1 and a first conductive pattern BP1. The first conductive pattern BP1 may be disposed between the first sensing patterns SP1 adjacent to each other and may connect the first sensing patterns SP1.

The second sensing electrode TE2 may extend in the first direction DR1 and may be provided in plural, and the second sensing electrodes TE2 may be arranged in the second direction DR2. The second sensing electrode TE2 may include second sensing patterns SP2 and second conductive patterns BP2. The second sensing patterns SP2 and the second conductive patterns BP2 may be patterned through the same process and may be provided integrally with each other, however, for the convenience of explanation, the patterns will be described separately as the second sensing patterns SP2 and the second conductive patterns BP2.

Sensing lines TL1, TL2, and TL3 may include a first sensing line TL1, a second sensing line TL2, and a third sensing line TL3.

The input sensing panel ISP-A may include a plurality of upper contact holes CTN-1, CTN-2, and CTN-3 defined in a peripheral area NAA-I. The upper contact holes CTN-1, CTN-2, and CTN-3 may be formed through the first sensing insulating layer TIL1 and the second sensing insulating layer TIL2 described with reference to FIG. 6. The upper contact holes CTN-1, CTN-2, and CTN-3 may overlap corresponding lower contact holes CTN1, CTN2, and CTN3.

One end of the first sensing line TL1 may be connected to the first sensing electrode TE1, and the other end of the first sensing line TL1 may extend to the third upper contact hole CTN-3. The other end of the first sensing line TL1 may be connected to the third contact line CTL3 (refer to FIG. 4) via the third lower contact hole CTN3 (refer to FIG. 4) and the third upper contact hole CTN-3 overlapping the third lower contact hole CTN3 (refer to FIG. 4).

One end of the second sensing line TL2 may be connected to one end of the second sensing electrode TE2, and the other end of the second sensing line TL2 may extend to the second upper contact hole CTN-2. The other end of the second sensing line TL2 may be connected to the second contact line CTL2 (refer to FIG. 4) via the second lower contact hole CTN2 (refer to FIG. 4) and the second upper contact hole CTN-2 overlapping the second lower contact hole CTN2 (refer to FIG. 4).

One end of the third sensing line TL3 may be connected to the other end of the second sensing electrode TE2, and the other end of the third sensing line TL3 may extend to the first upper contact hole CTN-1. The other end of the third sensing line TL3 may be connected to the first contact line CTL1 (refer to FIG. 4) via the first lower contact hole CTN1 (refer to FIG. 4) and the first upper contact hole CTN-1 overlapping the first lower contact hole CTN1 (refer to FIG. 4).

FIG. 11 is an enlarged view showing one sensing unit of the input sensing panel ISP-A.

The one sensing unit may include portions of each of the first sensing patterns SP1, which are disposed with the first conductive pattern BP1 interposed therebetween, and portions of each of the second sensing patterns SP2, which are integrally connected to each other with the second conductive pattern BP2 interposed therebetween. Meanwhile, according to an embodiment, the sensing unit may further include a plurality of dummy patterns DUP.

In the sensing unit, the first sensing patterns SP1 may include a first portion SP1$a$ and a second portion SP1$b$. The first portion SP1$a$ may surround first and third branch portions SP2$c$1 and SP2$c$3, and the second portion SP1$b$ may surround second and fourth branch portions SP2$c$2 and SP2$c$4.

In the sensing unit, the first conductive pattern BP1 may have a bent shape. As an example, the first conductive pattern BP1 may have one of an L-shape rotated in clockwise direction by about 90° and an L-shape rotated in counterclockwise direction by about 90° when viewed in a plan view.

In the sensing unit, each of the second sensing patterns SP2 may include extension portions SP2$a$ and SP2$b$ and the branch portions SP2$c$1 to SP2$c$4. The extension portions SP2$a$ and SP2$b$ may extend in the first direction DR1. The extension portions SP2$a$ and SP2$b$ may include a first extension portion SP2$a$ extending in the first direction DR1 and a second extension portion SP2$b$ extending from the first extension portion SP2$a$ in a first cross direction DRa and a second cross direction DRb.

The first to fourth branch portions SP2$c$1 to SP2$c$4 may extend in the first cross direction DRa and the second cross direction DRb with the second conductive pattern BP2 interposed therebetween.

In the sensing unit, the second conductive pattern BP2 may be disposed between portions of the first sensing patterns SP1, which protrude toward each other along the second direction DR2. The second conductive pattern BP2 may connect the first extension portions SP2$a$ of the second sensing patterns SP2 to each other.

Each of the dummy patterns DUP may be a pattern electrically floated. Each of the dummy patterns DUP may be insulated from the first and second sensing electrodes TE1 and TE2. The dummy patterns DUP may include first-to-fourth dummy patterns DUP1 to DUP4 disposed at different positions from each other.

According to the present embodiment, the first sensing pattern SP1 and the second sensing electrode TE2 may form the second conductive layer TML2 described with reference to FIG. 6. The first conductive pattern BP1 may form the first conductive layer TML1. The first sensing patterns SP1 may be connected to a corresponding first conductive pattern BP1 via a sensing contact hole defined through the second sensing insulating layer TIL2.

Referring to FIG. 12, the input sensing panel ISP-A may include the passivation layer PVX-A. The passivation layer PVX-A may be disposed on the second conductive layer TML2 (refer to FIG. 6) and may be covered by the third sensing insulating layer TIL3 (refer to FIG. 6).

According to the present embodiment, the passivation layer PVX-A may be disposed directly on the first sensing patterns SP1 and the second sensing electrode TE2 of the second conductive layer TML2, which overlap the active area AA-I. Accordingly, the passivation layer PVX-A may not overlap the peripheral area NAA-I.

The passivation layer PVX-A may have a shape corresponding to the first sensing patterns SP1, the second sensing patterns SP2, and the second conductive pattern BP2 when viewed in a plan view. That is, the passivation layer PVX-A may be formed through the same process as the first sensing patterns SP1, the second sensing patterns SP2, and the second conductive pattern BP2, which are disposed on the second conductive layer TML2, using the same mask, and thus, the passivation layer PVX-A may have the shape corresponding to the first sensing patterns SP1, the second sensing patterns SP2, and the second conductive pattern BP2 when viewed in a plan view.

According to the present embodiment, the passivation layer PVX-A may have a permittivity higher than a permittivity of the third sensing insulating layer TIL3 (refer to FIG. 6) covering the passivation layer PVX-A. The passivation layer PVX-A may have a thickness less than a thickness of the third sensing insulating layer TIL3 (refer to FIG. 6) covering the passivation layer PVX-A.

The passivation layer PVX-A may include a material different from that of the third sensing insulating layer TIL3 (refer to FIG. 6) covering the passivation layer PVX-A. As an example, the passivation layer PVX-A may include an inorganic material. The inorganic material may include at least one of silicon oxide and silicon nitride. The third sensing insulating layer TIL3 (refer to FIG. 6) may include an acrylic-based organic material.

Figure 13:
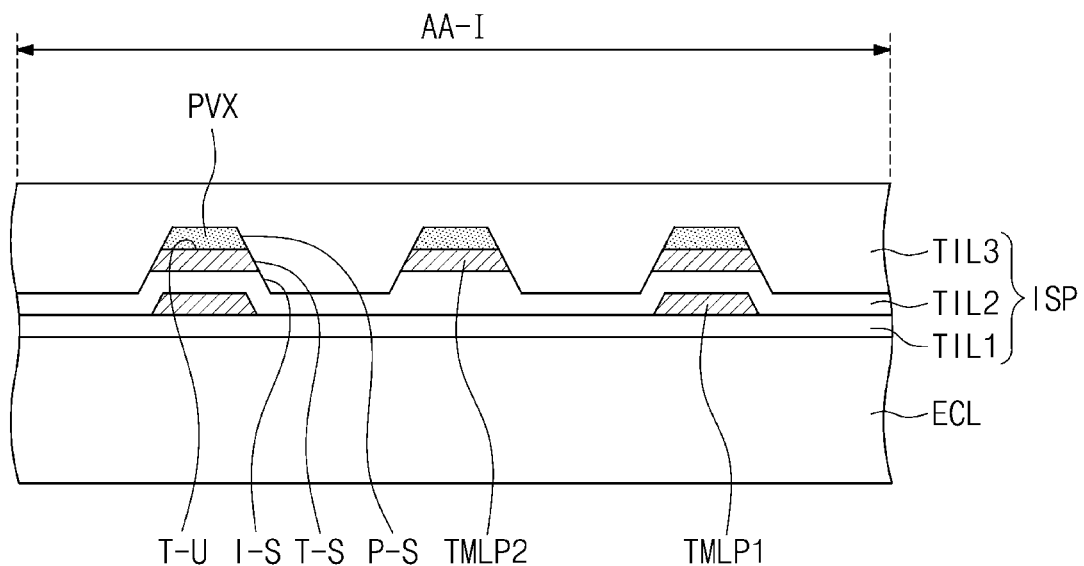
FIG. 13 is a cross-sectional view showing an input sensing panel according to an embodiment of the present invention.
Figure 14:
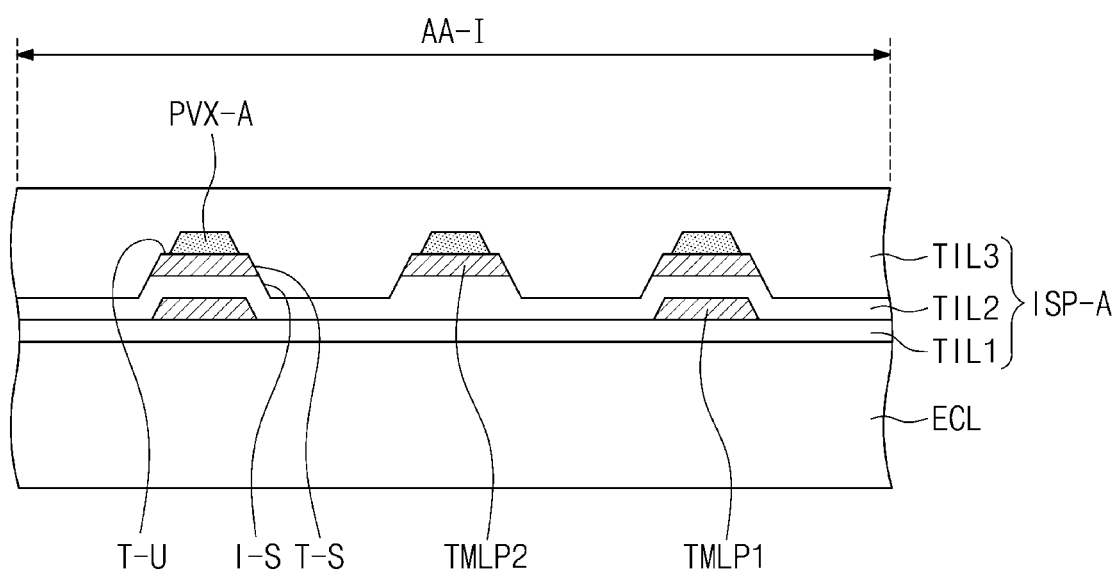
FIG. 14 is a cross-sectional view showing an input sensing panel according to an embodiment of the present invention.
Figure 15:
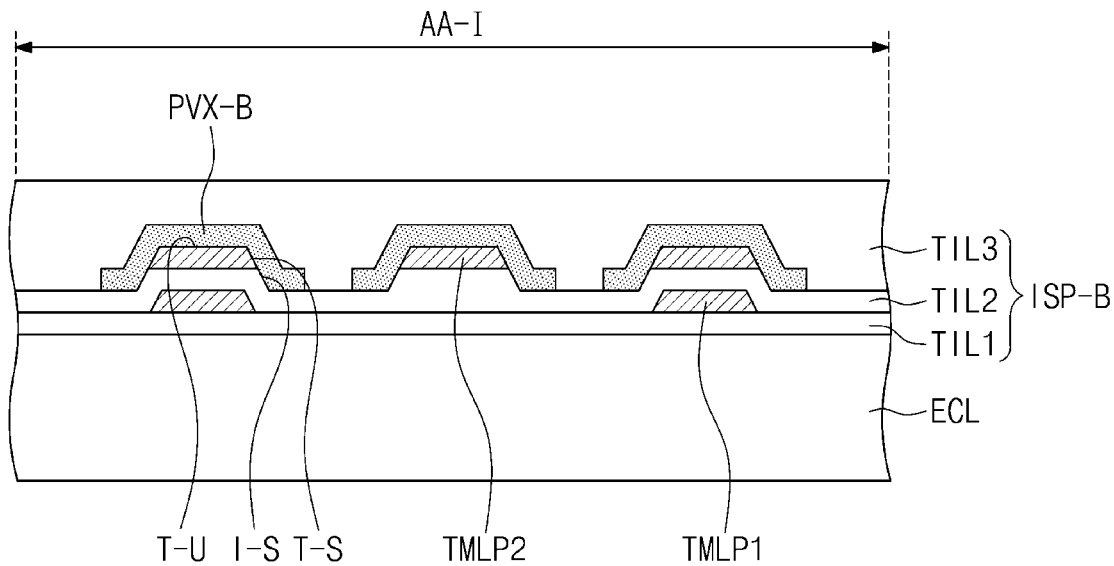
FIG. 15 is a cross-sectional view showing an input sensing panel according to an embodiment of the present invention.
Figure 16:
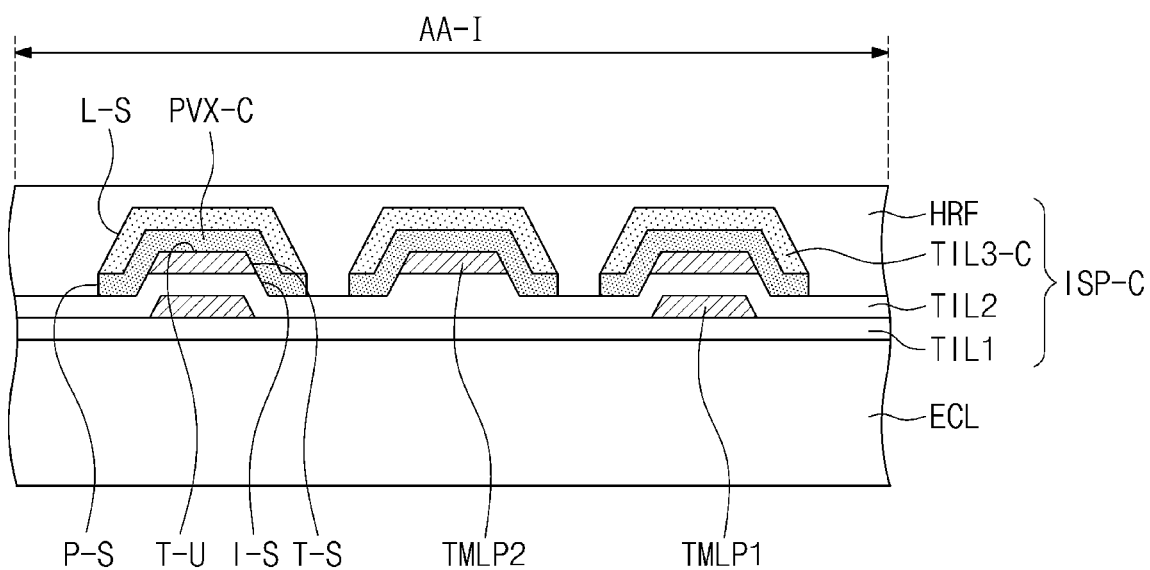
FIG. 16 is a cross-sectional view showing an input sensing panel according to an embodiment of the present invention.

FIG. 13 is a cross-sectional view showing an input sensing panel ISP according to an embodiment of the present invention. FIG. 14 is a cross-sectional view showing an input sensing panel ISP-A according to an embodiment of the present invention. FIG. 15 is a cross-sectional view showing an input sensing panel ISP-B according to an embodiment of the present invention. FIG. 16 is a cross-sectional view showing an input sensing panel ISP-D according to an embodiment of the present invention. In FIGS. 13 to 16, the same/similar reference numerals denote the same/similar elements in FIGS. 1 to 12, and thus, detailed descriptions of the same/similar elements will be omitted.

Hereinafter, a first conductive pattern TMLP1 and a second conductive pattern TMLP2, which are described with reference to FIGS. 13 to 16, may be components included in the first conductive layer TML1 and the second conductive layer TML2 overlapping the active area AA-I among the patterns described with reference to FIGS. 6 to 12.

Referring to FIG. 13, the input sensing panel ISP may be disposed on a thin film encapsulation layer ECL. The input sensing panel ISP may include sensing insulating layers TIL1, TIL2, and TIL3, the conductive patterns TML1 and TML2, and a passivation layer PVX.

A first sensing insulating layer TIL1 may be disposed directly on the thin film encapsulation layer ECL. The first conductive pattern TMLP1 may be disposed on the first sensing insulating layer TIL1. A second sensing insulating layer TIL2 may be disposed on the first sensing insulating layer TIL1 and may cover the first conductive pattern TMLP1. The second conductive pattern TIL2 may be disposed on the second sensing insulating layer TIL2. The passivation layer PVX may be disposed on the second conductive pattern TIL2. A third sensing insulating layer TIL3 may be disposed on the second sensing insulating layer TIL2 and may cover the second conductive pattern TMLP2 and the passivation layer PVX.

According to the present embodiment, a portion of the second sensing insulating layer TIL2, which overlaps the second conductive pattern TMLP2, may include a side surface I-S protruding to a thickness direction compared with another portion of the second sensing insulating layer TIL2, which is adjacent to the portion of the second sensing insulating layer TIL2.

The second conductive pattern TMLP2 may include an upper surface T-U that is in contact with the passivation layer PVX and a side surface T-S connected to the upper surface T-U. According to the present embodiment, the upper surface T-U of the second conductive pattern TMLP2 may be entirely covered by the passivation layer PVX.

The passivation layer PVX may include a side surface P-S. According to the present embodiment, the side surface P-S of the passivation layer PVX, the side surface T-S of the second conductive pattern TMLP2, and the side surface I-S of the second sensing insulating layer TIL2 may be aligned with each other. In addition, the aligned side surfaces P-S, T-S, and I-S may be inclined at a predetermined angle with respect to the second sensing insulating layer TIL2.

Referring to FIG. 14, the input sensing panel ISP-A may be disposed on a thin film encapsulation layer ECL. The input sensing panel ISP-A may include sensing insulating layers TIL1, TIL2, and TIL3, the conductive patterns TML1 and TML2, and a passivation layer PVX-A.

According to the present embodiment, a portion of a second sensing insulating layer TIL2, which overlaps the second conductive pattern TMLP2, may include a side surface I-S protruding to a thickness direction compared with another portion of the second sensing insulating layer TIL2, which is adjacent to the portion of the second sensing insulating layer TIL2.

The second conductive pattern TMLP2 may include an upper surface T-U that is in contact with the passivation layer PVX-A and a side surface T-S connected to the upper surface T-U. According to the present embodiment, the upper surface T-U of the second conductive pattern TMLP2 may be aligned with the side surface I-S of the second sensing insulating layer TIL2. In addition, the aligned side surfaces T-S and I-S may be inclined at a predetermined angle with respect to the second sensing insulating layer TIL2.

According to the present embodiment, a portion of the upper surface T-U of the second conductive pattern TMLP2 may be exposed without being covered by the passivation layer PVX-A. The portion of the upper surface T-U of the second conductive pattern TMLP2, which is not covered by the passivation layer PVX-A, may be in contact with a third sensing insulating layer TIL3.

Referring to FIG. 15, the input sensing panel ISP-B may be disposed on a thin film encapsulation layer ECL. The input sensing panel ISP-B may include sensing insulating layers TIL1, TIL2, and TIL3, the conductive patterns TML1 and TML2, and a passivation layer PVX-B.

According to the present embodiment, a portion of a second sensing insulating layer TIL2, which overlaps the second conductive pattern TMLP2, may include a side surface I-S protruding to a thickness direction compared with another portion of the second sensing insulating layer TIL2, which is adjacent to the portion of the second sensing insulating layer TIL2.

The second conductive pattern TMLP2 may include an upper surface T-U that is in contact with the passivation layer PVX-B and a side surface T-S connected to the upper surface T-U. According to the present embodiment, the side surface T-S of the second conductive pattern TMLP2 may be aligned with the side surface I-S of the second sensing insulating layer TIL2. In addition, the aligned side surfaces T-S and I-S may be inclined at a predetermined angle with respect to the second sensing insulating layer TIL2.

According to the present embodiment, the passivation layer PVX-B may be in contact with the upper surface T-U and the side surface T-S of the second conductive pattern TMLP2 and the side surface I-S of the second sensing insulating layer TIL2.

Referring to FIG. 16, the input sensing panel ISP-C may be disposed on a thin film encapsulation layer ECL. The input sensing panel ISP-C may include sensing insulating layers TIL1, TIL2, and TIL3-C, the conductive patterns TML1 and TML2, a passivation layer PVX-C, and a high refractive index layer HRF.

According to the present embodiment, a portion of a second sensing insulating layer TIL2, which overlaps the second conductive pattern TMLP2, may include a side surface I-S protruding to a thickness direction compared with another portion of the second sensing insulating layer TIL2, which is adjacent to the portion of the second sensing insulating layer TIL2.

The second conductive pattern TMLP2 may include an upper surface T-U that is in contact with the passivation layer PVX-C and a side surface T-S connected to the upper surface T-U. According to the present embodiment, the side surface T-S of the second conductive pattern TMLP2 may be aligned with the side surface I-S of the second sensing insulating layer TIL2. In addition, the aligned side surfaces T-S and I-S may be inclined at a predetermined angle with respect to the second sensing insulating layer TIL2.

The passivation layer PVX-C may be in contact with the upper surface T-U and the side surface T-S of the second conductive pattern TMLP2 and the side surface I-S of the second sensing insulating layer TIL2.

According to the present embodiment, a third sensing insulating layer TIL3-C may be patterned to cover the passivation layer PVX-C. Accordingly, a side surface P-S of the passivation layer PVX-C may be exposed without being covered by the third sensing insulating layer TIL3-C.

According to the present embodiment, the input sensing panel ISP-C may include the high refractive index layer HRF covering the third sensing insulating layer TIL3-C. The high refractive index layer HRF may be disposed on the second sensing insulating layer TIL2 and may provide a flat surface.

The high refractive index layer HRF may have a refractive index that is the same as or lower than that of the passivation layer PVX-C and may have a refractive index higher than that of the third sensing insulating layer TIL-3. Accordingly, although a light provided from the display panel DP is provided to the third sensing insulating layer TIL3-C via the high refractive index layer HRF, a total reflection may occur easily. Accordingly, the input sensing panel ISP-C may reduce a loss of the light provided from the display panel DP.

The high refractive index layer HRF may include a base layer having a polymeric material and a high refractive index material included in the base layer. The base layer may include at least one of an acrylic-based material, an epoxy-based material, a siloxane-based material, an imide-based material, and compounds thereof, for example, polydiarylsiloxane, methyltrimethoxysilane, or tetramethoxysilane.

The high refractive index material may include at least one of zirconium oxide ($ZrO_2$), titanium oxide ($TiO_2$), silicon oxide ($SiO_2$), zinc oxide ($ZnO_2$), and mixtures thereof.

FIGS. 17A to 17E are cross-sectional views showing a method of manufacturing an input sensing panel according to an embodiment of the present disclosure. FIGS. 18A to 18E are cross-sectional views showing a method of manufacturing an input sensing panel according to an embodiment of the present invention. In FIGS. 17A to 17E and 18A to 18E, the same/similar reference numerals denote the same/similar elements in FIG. 1 to 13, and thus, detailed descriptions of the same/similar elements will be omitted.

FIGS. 17A to 17E show a method of manufacturing components formed in the active area AA-I of the input sensing panel ISP, and FIG. 18A to 18E show a method of manufacturing components formed in the peripheral area NAA-I of the input sensing panel ISP. Hereinafter, drawings related to the same process will be described together.

Figure 17A:
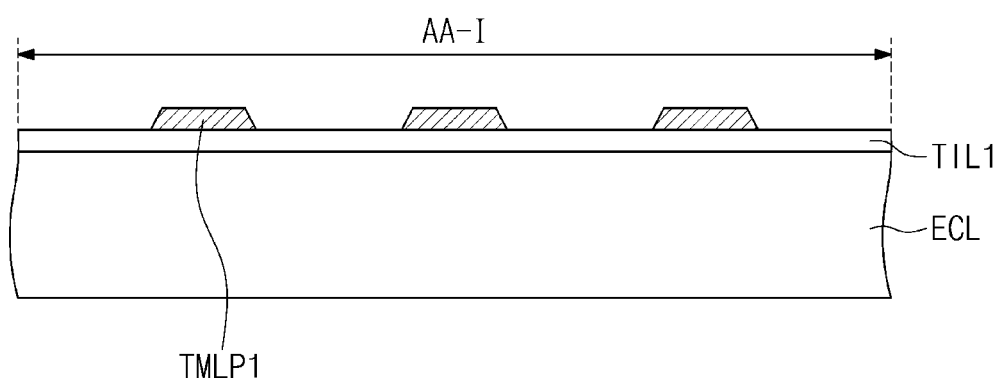
FIGS. 17A, 17B, 17C, 17D, and 17E are cross-sectional views showing a method of manufacturing an input sensing panel according to an embodiment of the present invention.

Referring to FIG. 17A, the manufacturing method of the display device may include forming the first sensing insulating layer TIL1 on the thin film encapsulation layer ECL and forming the first conductive pattern TMLP1 on the first sensing insulating layer TIL1.

The first sensing insulating layer TIL1 may be formed by depositing an inorganic material on the thin film encapsulation layer ECL. The first conductive pattern TMLP1 may be formed by coating a conductive material on the first sensing insulating layer TIL1 and selectively patterning the conductive material using a photolithography process.

Figure 17B:
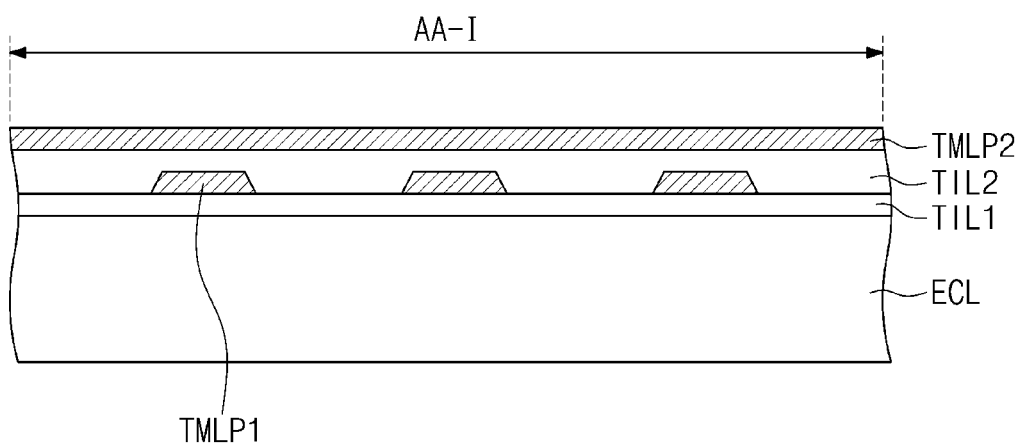
Figure 17C:
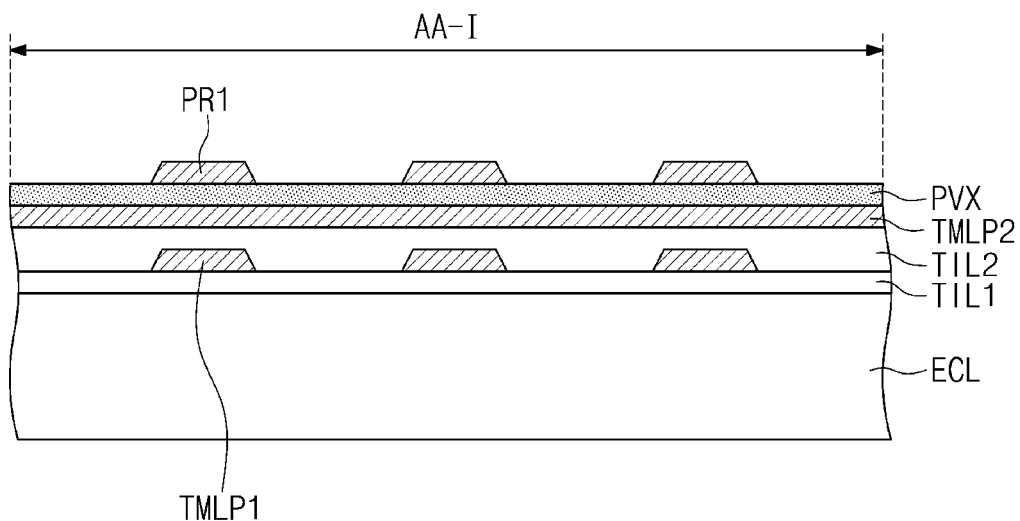
Figure 17D:
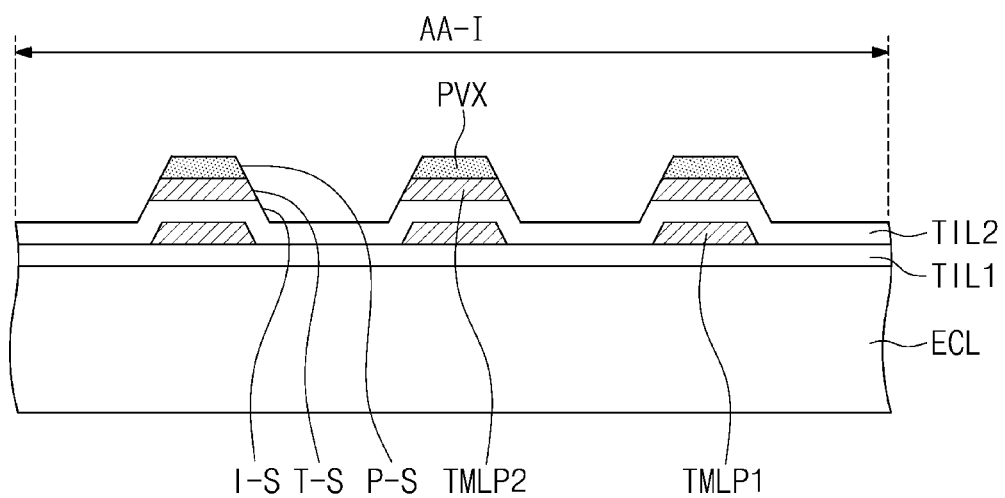

Then, referring to FIGS. 17B to 17D, the manufacturing method of the display device may include forming the second sensing insulating layer TIL2 on the first sensing insulating layer TIL1, forming the second conductive pattern TMLP2 on the second sensing insulating layer TIL2, and forming the passivation layer PVX on the second conductive pattern TMLP2.

The second sensing insulating layer TIL2 may be formed on the first sensing insulating layer TIL1 by a deposition process. Then, a conductive material may be coated on the second sensing insulating layer TIL2 to form the second conductive pattern TMLP2, and an inorganic material may be deposited on the second conductive pattern TMLP2 to form the passivation layer PVX.

After that, the passivation layer PVX and the second conductive pattern TMLP2 may be etched together through a photolithograph process using a first mask PM. Accordingly, the side surface P-S of the passivation layer PVX and the side surface T-S of the second conductive pattern TMLP2 may be aligned with each other.

In this case, a portion of the second sensing insulating layer TIL2, which does not overlap the second conductive pattern TMLP2, may be removed due to an etch rate. Accordingly, a step difference may occur between the portion of the second sensing insulating layer TIL2, which overlaps the second conductive pattern TMLP2, and the portion of the second sensing insulating layer TIL2, which does not overlap the second conductive pattern TMLP2.

According to the manufacturing method of the display device, the side surface P-S of the passivation layer PVX, the side surface T-S of the second conductive pattern TMLP2, and the side surface I-S of the second sensing insulating layer TIL2 may be aligned with each other, and the aligned side surfaces P-S, T-S, and I-S may be inclined at the predetermined angle with respect to the second sensing insulating layer TIL2.

Referring to FIGS. 18A to 18D, a process of forming an upper contact hole TPN through the first sensing insulating layer TIL1 and the second sensing insulating layer TIL2 and a process of forming a sensing line TDT overlapping the upper contact hole TPN may be performed while the processes described with reference to FIGS. 17A to 17E are performed in the peripheral area NAA-I. The upper contact hole TPN may correspond to one of the upper contact holes CTN-1, CTN-2, and CTN-3 described with reference to FIG. 7, and the sensing line TDT may correspond to one of the sensing lines TL1, TL2, and TL3 described with reference to FIG. 7.

Figure 18A:
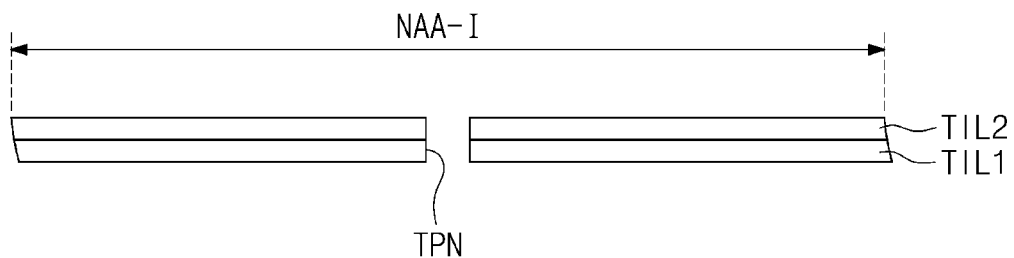
FIGS. 18A, 18B, 18C, 18D, and 18E are cross-sectional views showing a method of manufacturing an input sensing panel according to an embodiment of the present invention.

The upper contact hole TPN may be formed through the first sensing insulating layer TIL1 and the second sensing insulating layer TIL2 after the first sensing insulating layer TIL1 and the second sensing insulating layer TIL2 are formed, as shown in FIG. 18A.

In this case, the lower contact holes CTN1, CTN2, and CTN3 described with reference to FIG. 4 may be substantially simultaneously formed to penetrate through the insulating layers included in the display panel DP described with reference to FIG. 5B.

Figure 18B:
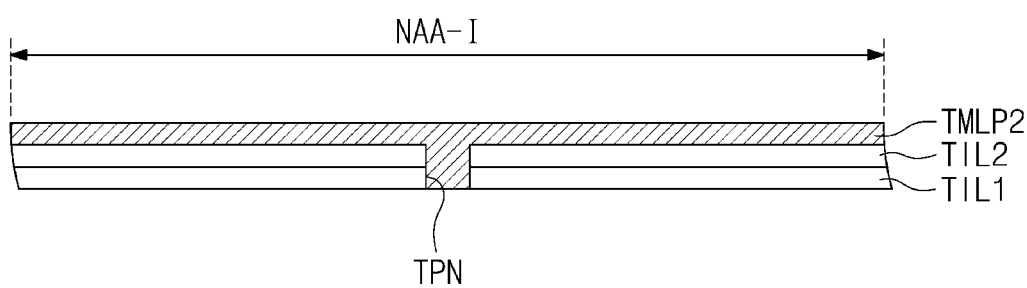
Figure 18C:
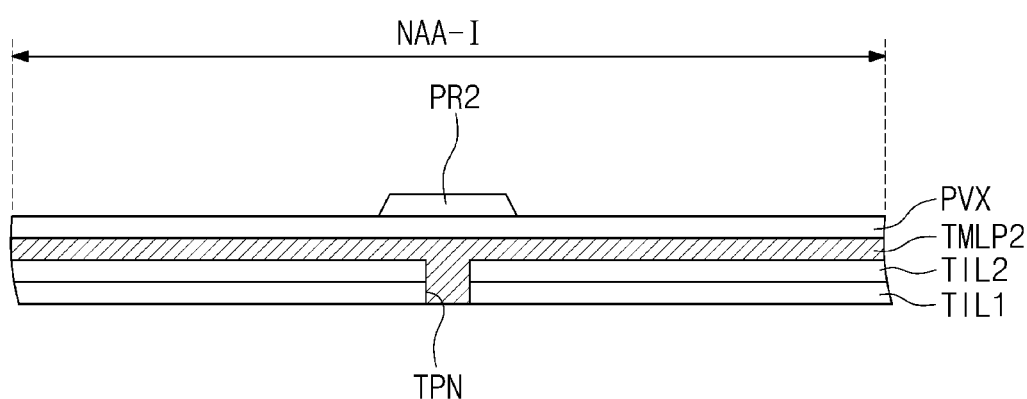

Then, a conductive material may be coated on the second sensing insulating layer TIL2 to form the second conductive pattern TMLP2, as shown in FIG. 18B. After that, the passivation layer PVX may be formed on the second conductive pattern TMLP2, as shown in FIG. 18C.

Figure 18D:
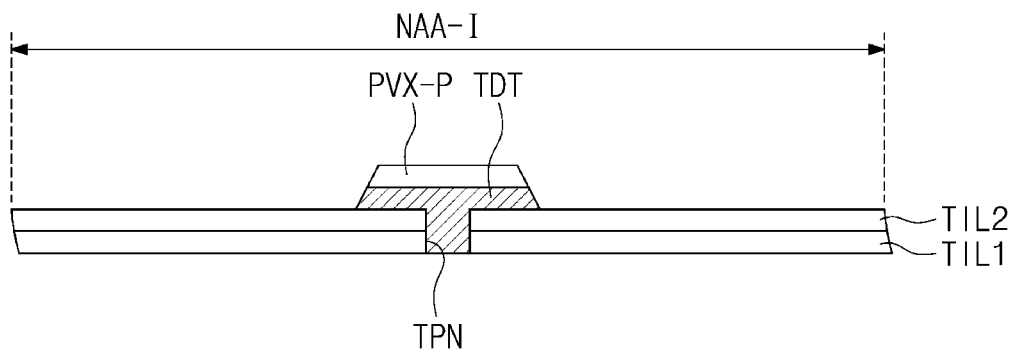

Then, the passivation layer PVX and the second conductive pattern TMLP2 may be etched together through a photolithography process using a second mask PR2, as shown in FIG. 18D. The patterned second conductive pattern TMLP2 may be provided as the sensing line TDT. The sensing line TDT may correspond to a portion of the sensing line overlapping the upper contact holes CNT-1, CNT-2, and CNT-3 among the sensing lines TL1, TL2, and TL3 described with reference to FIG. 7.

Figure 17E:
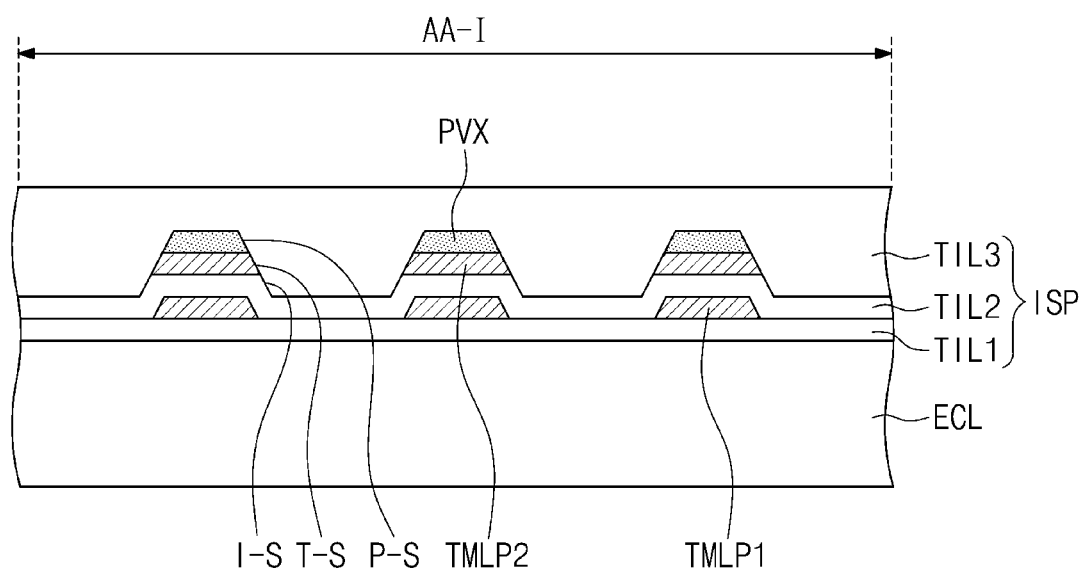

Next, referring to FIG. 17E, the manufacturing method of the display device may include forming the third sensing insulating layer TIL3 on the second sensing insulating layer TIL2. The third sensing insulating layer TIL3 may be formed by coating the organic material on the second sensing insulating layer TIL2.

In this case, the third sensing insulating layer TIL3 may not be deposited in the peripheral area NAA-I or may be patterned after being deposited to expose the sensing line TDT.

Figure 18E:
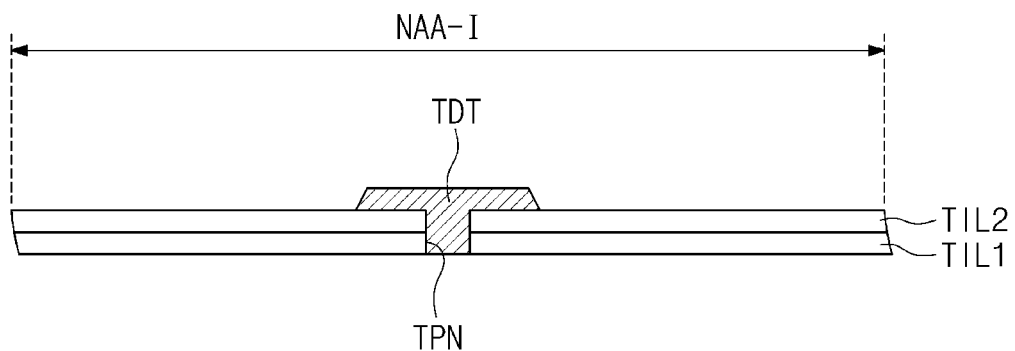

Referring to FIG. 18E, the manufacturing method of the display device may further include removing the passivation layer PVX-P formed on the sensing line TDT in the peripheral area NAA-I. Accordingly, the sensing line TDT may be connected to the corresponding contact lines CTL1, CTL2, and CTL3 (refer to FIG. 4) through the lower contact holes CNT1, CNT2, and CNT3 (refer to FIG. 4) overlapping the upper contact hole TPN.

Although certain exemplary embodiments and implementations have been described herein, other embodiments and modifications will be apparent from this description. Accordingly, the inventive concept is not limited to such embodiments, but rather to the broader scope of the appended claims and various obvious modifications and equivalent arrangements as would be apparent to a person of ordinary skill in the art.

What is claimed is:
1. A display device comprising:
a display panel comprising a base layer, a circuit element layer comprising a transistor disposed on the base layer, a display element layer comprising a light emitting element connected to the transistor, and a thin film encapsulation layer covering the display element layer; and
an input sensing panel comprising a first sensing insulating layer disposed directly on the thin film encapsulation layer, a first conductive layer disposed on the first sensing insulating layer, a second sensing insulating layer covering the first conductive layer, a second conductive layer disposed on the second sensing insulating layer, a passivation layer disposed on the second conductive layer, and a third sensing insulating layer covering the passivation layer,
wherein the passivation layer has a permittivity higher than a permittivity of the third sensing insulating layer.
2. The display device of claim 1, wherein the passivation layer comprises one of silicon nitride, silicon oxide, and silicon oxynitride, and the third sensing insulating layer comprises an organic material.
3. The display device of claim 1, wherein the passivation layer makes contact with the second conductive layer and has a shape corresponding to the second conductive layer when viewed in a plan view.
4. The display device of claim 1, wherein the passivation layer has a thickness less than a thickness of the third sensing insulating layer.
5. The display device of claim 1, wherein a side surface of the passivation layer and a side surface of the second conductive layer are aligned with each other and are inclined at a predetermined angle with respect to the second sensing insulating layer.
6. The display device of claim 1, wherein a portion of the second sensing insulating layer, which overlaps the passivation layer, has a thickness greater than a thickness of the other portion of the second sensing insulating layer.
7. The display device of claim 1, wherein a portion of an upper surface of the second conductive layer that makes contact with the passivation layer is in contact with the third sensing insulating layer without being covered by the passivation layer.
8. The display device of claim 1, wherein an upper surface of the second conductive layer and a side surface connected to the upper surface of the second conductive layer are covered by the passivation layer.
9. The display device of claim 8, further comprising a high refractive index layer covering the third sensing insulating layer and having a refractive index higher than a refractive index of the third sensing insulating layer,
wherein a side surface of the passivation layer is exposed without being covered by the third sensing insulating layer.
10. The display device of claim 1, wherein the input sensing panel comprises:
a first sensing electrode comprising first sensing patterns arranged in a first direction and a conductive pattern disposed between the first sensing patterns;
a second sensing electrode insulated from the first sensing electrode and extending in a second direction crossing the first direction; and
sensing lines connected to the first sensing electrode and the second sensing electrode, the first conductive layer comprises the conductive pattern and a portion of the sensing lines, and the second conductive layer com- prises the first sensing patterns, the second sensing electrode, and the other portion of the sensing lines.

11. The display device of claim 10, wherein the second conductive layer comprises a plurality of mesh lines extending in directions crossing each other, and the passivation layer has a shape corresponding to the mesh lines when viewed in a plan view.

12. The display device of claim 10, wherein the passivation layer does not overlap the sensing lines.

13. The display device of claim 11, wherein the first sensing patterns are connected to the conductive pattern via a sensing contact hole defined through the second sensing insulating layer.

14. The display device of claim 1, wherein the input sensing panel senses an external input by a capacitance method.

15. An input sensing panel comprising:
a first sensing insulating layer;
a first conductive layer disposed on the first sensing insulating layer;
a second sensing insulating layer covering the first conductive layer;
a second conductive layer disposed on the second sensing insulating layer;
a passivation layer disposed on the second conductive layer; and
a third sensing insulating layer covering the passivation layer,
wherein a side surface of the passivation layer and a side surface of the second conductive layer are aligned with each other and are inclined at a predetermined angle with respect to the second sensing insulating layer.

16. The display device of claim 15, wherein the passivation layer comprises one of silicon nitride, silicon oxide, and silicon oxynitride, and the third sensing insulating layer comprises an organic material.

17. The display device of claim 16, wherein the passivation layer has a permittivity higher than a permittivity of the third sensing insulating layer.

* * * * *